(12) United States Patent
Takaiti et al.

(10) Patent No.: US 6,494,671 B1
(45) Date of Patent: Dec. 17, 2002

(54) METHOD AND APPARATUS FOR COLLECTIVELY CHANGING COMPONENTS AT COMPONENT SUPPLY SECTION

(75) Inventors: Susumu Takaiti, Yamanashi (JP); Kazuhiko Narikiyo, Kofu (JP); Takao Naito, Yamanashi (JP); Kanji Hata, Katano (JP); Yoshinori Seki, Kofu (JP); Takeshi Kuribayashi, Yamanashi (JP); Hiroyoshi Nishida, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/043,694

(22) PCT Filed: Sep. 27, 1996

(86) PCT No.: PCT/JP96/02800

§ 371 (c)(1), (2), (4) Date: Mar. 26, 1998

(87) PCT Pub. No.: WO97/12506

PCT Pub. Date: Apr. 3, 1997

(30) Foreign Application Priority Data

Sep. 27, 1995 (JP) .............................................. 7-249741

(51) Int. Cl.[7] .............................................. B65G 67/02
(52) U.S. Cl. ....................... 414/809; 414/396; 414/401; 414/498; 414/518
(58) Field of Search ................................ 414/396, 401, 414/498, 518, 539, 584; 809/660

(56) References Cited

U.S. PATENT DOCUMENTS

| | | | | |
|---|---|---|---|---|
| 4,597,709 A | * | 7/1986 | Yonezawa | 414/401 |
| 4,697,974 A | * | 10/1987 | Eltoukhy | 414/401 X |
| 5,354,153 A | * | 10/1994 | Ottone et al. | 414/401 X |
| 5,387,063 A | * | 2/1995 | Napierkowski et al. | 414/401 X |
| 5,400,497 A | | 3/1995 | Watanabe et al. | 29/705 |
| 5,453,735 A | * | 9/1995 | Hahn | 414/401 X |
| 5,655,869 A | * | 8/1997 | Scheler et al. | 414/401 X |
| 6,033,175 A | * | 3/2000 | Pflueger et al. | 414/401 |

FOREIGN PATENT DOCUMENTS

| | | |
|---|---|---|
| DE | 36 33 478 | 3/1988 |
| EP | 0 391 707 | 10/1990 |
| EP | 0 427 243 | 5/1991 |
| GB | 2 262 516 | 6/1993 |

* cited by examiner

Primary Examiner—Janice L. Krizek
(74) Attorney, Agent, or Firm—Wenderoth, Lind & Ponack, L.L.P.

(57) ABSTRACT

A transfer rack 15 loaded with a seriate number of component supply cassettes 14 to be handled collectively is carried and retained on a truck 61 so that it can be taken in and out of the truck 61. The transfer rack 15 is passed between the truck 61 and a component supply section 8. Thus, the withdrawal of the transfer rack 15 from the component supply section 8 to the truck 61 and the delivery of the transfer rack 15 to the component supply section 8 are executed in a timely manner so as to change the component supply cassettes 14 at the component supply section 8. The transfer rack 15 delivered to the component supply section 8 is positioned by operating an automatic positioning means at the component supply section 8 in a direction in which it is loaded and unloaded and in a direction perpendicular to the direction in which it is loaded and unloaded.

26 Claims, 25 Drawing Sheets

Fig. 15A
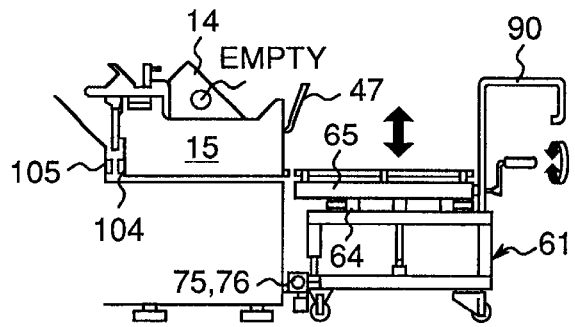
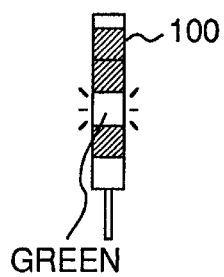
GREEN
Fig. 15B
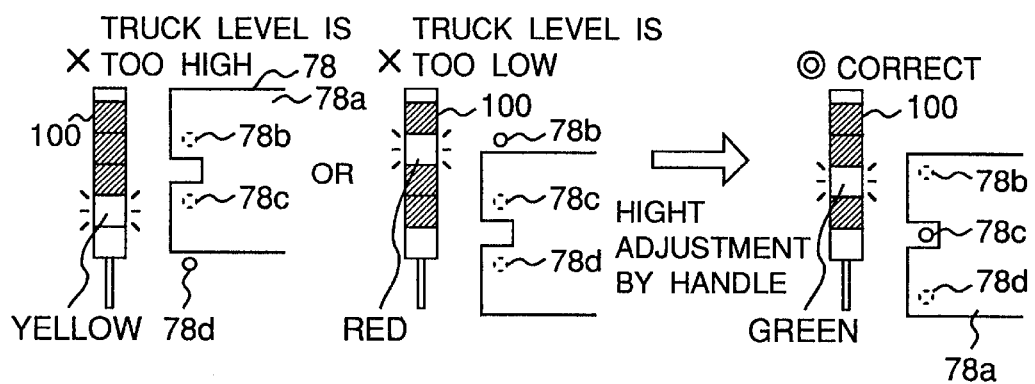

METHOD AND APPARATUS FOR COLLECTIVELY CHANGING COMPONENTS AT COMPONENT SUPPLY SECTION

TECHNICAL FIELD

The present invention relates to a method and apparatus for collectively changing components at a component supply section. For example, it relates to a method and apparatus for collectively changing components and a truck thereof to be applied to a component supply section of an objective working machine which uses a component supply cassette for feeding one-by-one a variety of minute components to be mounted to an electronic circuit board to supply them for use, thereby collectively changing components in units of a specified number of component supply cassettes.

BACKGROUND ART

When mounting electronic components onto electronic circuit boards, it is required to supply a number of electronic components at high speed.

Therefore, as a method of supplying electronic components, or in particular minute electronic components at high speed, there has been conventionally known a component supply cassette which handles minute components as so-called taping components formed by storing components in a number of component storing sections that are arranged in one direction of a storage tape and opened at a surface side. Thereafter, a covering tape is attached to the storage tape and it peels off the covering tape while feeding the taping components at a specified pitch to release each component storing section in a component supply position. This allows the component released in the component supply position to be taken out by a suction nozzle or the like for use.

On the other hand, as a substitute for it, there has been used a component supply cassette which stores a variety of components such as minute electronic components in a bulk cassette. The supply cassette then stirs up the components in a turbulence chamber by air while supplying the components into the turbulence chamber. The components that have been directed in a specified direction are transferred into a component feed path, and are fed to a specified component supply position by air while being aligned in a line in the component feed path to subject the components to use.

FIG. 27 shows a mounter A which uses such component supply cassettes B. This mounter A is to mount an electronic component "b" onto a printed board "a". A number of component supply cassettes B are arranged laterally in series corresponding to the number of types of electronic components "b" necessary for the mounter A on a component supply table "c" which serves as a component supply section provided beside the mounter A. The component supply unit B that is retaining the electronic component "b" of the type required each time is moved to the component supply position opposite to the mounter A.

The shown component supply cassette B is a type that uses a taping component. Including a component supply cassette of a type that feeds components from a bulk cassette while aligning them by air and the like, a cassette width C is set to, for example, about 16 mm. About 60 units of such cassettes are arranged in series on the component supply table "c" to be used properly at need.

For the above proper use, the component supply table "c" reciprocates the approximately 60 seriately arranged units of the component supply cassettes B in a direction in which they are arranged (i.e., in the x-direction in the figure). This shifts the required component supply cassette B to the component supply position.

The mounter A sucks each electronic component b that has been supplied from the component supply cassette B and placed in the component supply position by a suction nozzle "e" provided at a component mounting head "d" to mount the component onto the printed board "a". The printed board "a" is placed on an X-Y table "f"s as to be capable of moving in two directions of x and y that are perpendicular to each other, and is subjected to movement control in the two directions of x and y. Therefore, the electronic components "b" transferred to the mounting position as sucked by the suction nozzle "e" can be mounted at a specified position on the printed board "a".

When the components in the component supply cassette B are depleted or when the type of required component is to be changed, the component supply cassette B placed on the component supply table "c" is removed and replaced by a new component supply cassette B.

In order to surely supply the components from each component supply cassette, it is required to correctly position each component supply cassette B on the component supply table "c" and constantly correctly position the cassette corresponding to the component selection in the component supply position. Therefore, each component supply cassette B is provided with a positioning pin "p" as shown in FIG. 27. By being engaged with a positioning hole (not shown) provided on a support surface of the component supply table "c", the pin is correctly positioned in height, depth and width. A reel setting portion is received from below by a corrugated guide "q" provided at a portion of the component supply table "c" as shown in FIG. 28 to prevent the possible transverse vibration.

However, if the component supply cassette B is positioned one by one, it takes much time and labor, and this results in a low working efficiency. Furthermore, the operation of the objective working machine is stopped during this time, so that the productivity of the electronic circuit board or the like is lowered. Particularly in the case of a high-speed objective working machine or in the case of an objective working machine which simultaneously produces two electronic circuit boards, a high component consumption rate results. Therefore, it is desired to further increase the efficiency of the component changing procedure.

For the above reasons, a conventional cassette changing rack "i" as shown in FIG. 28 can be loaded with a number of component supply cassettes B to collectively handle them in changing each component supply cassette B on the component supply table "c." This changing rack is able to be mounted on and dismounted from the component supply table "c." The cassette changing rack "i'" serves to be carried by, mounted on and dismounted from the component supply table "c" while being loaded with a specified number of component supply cassettes arranged in series in a widthwise, direction, positioned, and retained. The changing rack "i" is positioned by engaging a clamp arm "'j" as shown in FIG. 28 with a part of the component supply table "c" in the mounting stage.

With the above arrangement, it is proper to preparatorily perform the loading and changing of the component supply cassettes B in the cassette changing rack "i" regardless of the mounting of the rack "i" to the component supply table "c" and change it for the cassette changing rack "i" mounted already on the component supply table "c" at the required point of time, so that the working efficiency increases.

However, according to the above-mentioned conventional art collective changing method, when handling the cassette changing rack "i", the operator lifts up its whole body by a pair of left and right carrying handles "k" provided at the cassette changing rack "i", carries it, and performs mounting and dismounting of the base at the component supply table "c". Therefore, the seriate number of the component supply cassettes B that can be handled collectively is limited in weight to about 10 kg, and this also leads to a limitation in weight to a seriated ten small-size component supply cassettes B. Furthermore, since the whole body is heavy and bulky, it is uneasy to handle, and much labor is required for the positioning work. Consequently, no reduction in time corresponding to the seriated number of cassettes collectively handled can be achieved and consequently about 30 minutes are taken, so that a further increase in efficiency is required. Furthermore, the positioning by the clamp arm "j" is hardly effective throughout the whole body of the cassette changing rack "i". In addition, because the cassette changing rack "i" loaded with the component supply cassettes B is heavy and uneasy to handle, the positioning by the clamp arm "j" tends to be rough, so that an inaccurate positioning tends to create problems in component supply.

Furthermore, if the diameter of the reel to be set is increased due to a dimensional increase of the taping components to be handled by the component supply cassette, the total weight and size of the component supply cassette to be handled are further increased. Therefore, such components cannot be handled with the cassette changing rack "i", meaning that only the conventional way of individually positioning and mounting of the cassettes to the component supply table "c" is left. Consequently, the working efficiency is not increased at all.

Accordingly, the present invention is intended to solve the aforementioned issues, and has an object to provide a method and apparatus for collectively changing components at a component supply section. A truck thereof is also provided that is capable of collectively handling a greater amount of component supply cassettes while receiving less influence due to the size of the cassettes so as to allow the cassettes to be changed easily in a short time with sure positioning satisfied.

SUMMARY OF THE INVENTION

In order to achieve the aforementioned object, the 1st aspect of the present invention provides a method of collectively changing components at a component supply section in which a number of component accommodating members for accommodating components (e.g., for use in feeding components one by one) are arranged in series at a component supply section of an objective working machine. Components are supplied from a component accommodating member corresponding to components required each time to the objective working machine. The components required are collectively changed or replenished on account of alteration of components and depletion of components due to consumption of the components, and every transfer rack is loaded with a specified number of component accommodating members which are individually positioned and supported. The transfer rack loaded with a seriate number of component accommodating members to be handled collectively is carried and passed to the component supply section for timely execution of withdrawal of the transfer rack from the component supply section and in order delivery of the transfer rack to the component supply section to change the component accommodating members at the component supply section, and the transfer rack delivered to the component supply section is positioned by operating at the component supply section an automatic positioning means in a direction in which it is loaded and unloaded and in a direction perpendicular to the direction in which it is loaded and unloaded.

In the modification of the 1st aspect, the transfer rack loaded with the seriate number of component accommodating members to be handled collectively is carried as retained in a truck while being able to be taken in and out. The transfer rack is passed between the truck and the component supply section for timely execution of withdrawal of the transfer rack from the component supply section to the truck and delivery of the transfer rack to the component supply section to change the component accommodating members at the component supply section.

The 2nd aspect of the invention provides a method for collectively changing components at a component supply section according to the 1st aspect of the invention. The component supply section includes two portions each equipped with a required seriate number of component accommodating members for supplying components to the objective working machine. While using one of the portions for supplying components, the other is made to stand by to be able to be used for changing the component accommodating members.

The 3rd aspect of the invention also provides a method for collectively changing components at a component supply section according to the 1st aspect of the invention. The seriate number of component accommodating members to be handled collectively is the required seriate number of component accommodating members for supplying components to the objective working machine.

The 4th aspect of the invention also provides a method for collectively changing components at a component supply section according to the 1st aspect of the invention. The seriate number of component accommodating members to be handled collectively is a unit division seriate number of component accommodating members of the required seriate number of component accommodating members for supplying components to the objective working machine.

The 5th aspect of the invention also provides a method for collectively changing components at a component supply section according to the 1st aspect of the invention. A change of the transfer rack at the component supply section is automatically detected. Upon the occurrence of the change, propriety of the components in each component accommodating member loaded in the transfer rack after the change is automatically decided.

The 6th aspect of the invention provides a method for collectively changing components at a component supply section according to the 5th aspect, wherein the decision of propriety is executed upon all component accommodating members.

The 7th aspect of the invention also provides a method for collectively changing components at a component supply section according to the 5th aspect of the invention. The decision of propriety is executed by using component information preparatorily stored in the transfer rack corresponding to the components stored in the component accommodating member loaded in the transfer rack.

The 8th aspect of the invention also provides a method for collectively changing components at a component supply section according to the 5th aspect of the invention, wherein the component information is stored in a storage means capable of reading and writing.

In order to achieve the aforementioned object, the 9th aspect of the invention provides an apparatus for collectively changing components at a component supply section. The apparatus comprises a component supply section which is equipped with a number of seriately arranged component accommodating members for feeding components (e.g., for use in feeding components one by one, so that they can be positioned, loaded and unloaded) and operates to supply components from a component accommodating member corresponding to the components required each time by an objective working machine. The apparatus also comprises a transfer rack loaded with component accommodating members so that they can be individually positioned, loaded and unloaded, and the transfer rack is able to collectively handle them.

In a modification of the 9th aspect, the apparatus further comprises a truck capable of moving with the transfer rack carried thereon. A guide means is provided at the component supply section and the truck for allowing the transfer rack pass between them for loading and unloading the transfer rack.

The 10th aspect of the invention provides an apparatus for collectively changing components at a component supply section according to the 9th aspect of the invention. The component supply section has a positioning means for automatically positioning a received transfer rack in a direction in which the transfer rack is loaded and unloaded, and in direction perpendicular to the direction in which the transfer rack is loaded and unloaded.

In a modification of the 10th aspect, the truck has a retaining means for retaining the received transfer rack and a height adjusting means for adjusting in height the received transfer rack.

The 11th aspect of the invention provides an apparatus for collectively changing components at a component supply section according to the 10th aspect of the invention. A height detecting means for detecting a relation in height of a transfer rack support section relative to the component supply section of the objective working machine is also provided.

The 12th aspect of the invention provides an apparatus for collectively changing components at a component supply section according to the 10th aspect of the invention. The positioning means at the component supply section comprises a front end portion receiving member which receives a front end portion of the transfer rack in a specified receiving position, and a first pressure member which protrudes into and retracts from a path in which the transfer rack is loaded and unloaded. The first pressure member operates to pressure the transfer rack from behind against the front end portion receiving member to position the transfer rack in a direction in which the transfer rack is loaded and unloaded, and to release the positioning effected by the pressure. The positioning means also comprises a side surface portion receiving member which is provided at a side of the path in which the transfer rack is loaded and unloaded. The receiving member operates to receive a side portion of the transfer rack in a specified position. In addition, the positioning means comprises a second pressure member which pressures the transfer rack against the side surface portion receiving member from the opposite side to position the transfer rack in a direction perpendicular to the direction in which the transfer, rack is loaded and unloaded.

The 13th aspect of the invention provides an apparatus for collectively changing components at a component supply section according to the 12th aspect of the invention, wherein the first pressure member is a lever member and the second pressure member is an eccentric shaft.

The 14th aspect of the invention provides an apparatus for collectively changing components at a component supply section according to the 12th aspect of the invention. The transfer rack has portions comprised of roller members for the abutment thereof against the front end portion receiving member and the first pressure member.

The 15th aspect of the invention provides an apparatus for collectively changing components at a component supply section according to the 9th aspect of the invention. The component supply section has guide rollers for guiding the transfer rack from both sides with play to a specified receiving position.

The 16th aspect of the invention also provides an apparatus for collectively changing components at a component supply section according to the 9th aspect of the invention. The component supply section has a positioning support section for supporting the received transfer rack so that the transfer rack is positioned at a specified height, and has a loading/unloading guide section for guiding the loading and unloading of the transfer rack by lifting the transfer rack from the positioning support section in loading and unloading the transfer rack.

The 17th aspect of the invention also provides an apparatus for collectively changing components at a component supply section according to the 9th aspect of the invention. A storage means is provided for storing component information regarding the type of component stored in each component accommodating member provided at the transfer rack, or of each component accommodating member supported on it. An installation/removal detecting means is also provided for detecting the installation or removal of the transfer rack with respect to the component supply section. A decision means is provided for deciding whether or not the transfer rack is changed based on the detection by the installation/removal detecting means and for deciding whether the component is suitable based on the component information stored in the storage means when the transfer rack is changed.

The 18th aspect of the invention provides an apparatus for collectively changing components at a component supply section according to the 17th aspect of the invention. A mode selecting means is provided for selecting between a variety of decision modes such as a mode of not deciding the propriety of each component, a mode of deciding all component accommodating members, and a mode of deciding only required accommodating members. The decision means executes a decision in a selected mode.

The 19th aspect of the invention provides an apparatus for collectively changing components at a component supply section according to the 17th aspect of the invention, wherein the storage means is capable of reading and writing.

In order to achieve the aforementioned object, the 20th aspect of the invention provides a transfer rack which is loaded with a specified number of component accommodating members positioned and supported individually. The transfer rack comprises a storage means for storing component information regarding the type of component and the like stored in each supported component accommodating member.

In order to achieve the aforementioned object, the 21st aspect of the invention provides a truck for collectively changing components at a component supply section. The truck comprises a main body having running wheels, and the main body is provided with a guide means for guiding the transfer rack in passing the transfer rack by loading and unloading the transfer rack at a component supply section of an objective working machine. The truck also comprises a retaining means for retaining the transfer rack received on the guide means.

The 22nd aspect of the invention provides a truck according to the 21st aspect of the invention, further comprising a stopper means for preventing the main body from running on the running wheels.

The 23rd aspect of the invention provides a truck according to the 21st aspect of the invention, further comprising a connecting means for connecting the component supply section with the main body in a state in which the main body is put in a specified positional relation with the component supply section of the objective working machine.

The 24th aspect of the invention provides a truck according to the 21st aspect of the invention, further comprising a height adjusting means for adjusting in height a transfer rack support section.

Examples of the component accommodating member are a tray or a component supply cassette. Specifically, in embodiments of the present invention described later, a component supply cassette corresponds to one example of the component accommodating member.

According to the above construction of the method and apparatus for collectively changing components at a component supply section of the 1st and 9th aspects of the invention, a number of component supply cassettes are arranged seriately at the component supply section of the objective working machine. When operating the supply cassette corresponding to the component required each time by the objective working machine in order to supply the required component to the objective working machine for the execution of the change of components and the supply of components depleted due to consumption, a specified number of component supply cassettes are handled in a lot with the transfer rack loaded with the component supply cassettes that are individually positioned and supported for the collective change.

In the above case, the transfer rack is carried in the truck while being able to be taken in and out of the truck. Therefore, even when the seriate number of component supply cassettes to be loaded in the transfer rack is great and the cassettes are large, bulky and heavy, the transfer rack can be easily moved together with the truck without being influenced by these factors. Furthermore, the transfer rack loaded with the component supply cassettes is passed between the truck and the component supply section to timely execute the withdrawal of the transfer rack from the component supply section onto the truck and the delivery of the transfer rack to the component supply section for the collective change of the component supply cassettes. Therefore, also in the collective change operation, the weight and bulkiness of the transfer rack loaded with the component supply cassettes exert almost no influence on the operator. Consequently, the collective change of components can be achieved easily and speedily without being limited by the seriate number, size and weight of the component supply cassettes to be handled collectively. This is helpful in further increasing the operation speed and the working efficiency of the objective working machine.

Futhermore, particularly in accordance with the 1st aspect of the invention, the transfer rack delivered to the component supply section is automatically positioned in the direction in which it is loaded and unloaded and in the direction perpendicular to the direction in which it is loaded and unloaded by operating the automatic positioning means. Therefore, the positioning can be achieved surely in the two directions without individual differences, and can be achieved speedily because of the automatic operation. Therefore, also in this point, the working efficiency increases and the possible trouble due to a deficiency in supplying components can be solved.

Furthermore, particularly in accordance with the 9th aspect of the invention, the guide means provided at the component supply section and the truck guide the loading and unloading of the transfer rack when passing it between them. Therefore, the loading and unloading of the transfer rack for the passing can be smoothly achieved without hitching, and this allows the working efficiency to be further increased.

According to the above construction of the method for collectively changing components at a component supply section of the 2nd aspect of the present invention, the two component supply sections are each provided with a seriate number of component supply cassettes required for supplying components to the objective working machine. While supplying the components to the objective working machine by one component supply section, the other component supply section is put in the standby state so that it can perform a collective change of components without influencing the work at the objective working machine for the preparation for supplying subsequent components. Therefore, the change of components at the objective working machine can be accomplished by only switching the use of the component supply sections. Therefore, the possible loss time at the objective working machine can be suppressed to the minimum, and the collective change of the component supply cassettes can be easily achieved in minimal time.

Furthermore, according to the above construction of the method for collectively changing components at a component supply section of the 3rd aspect of the invention, number of component supply cassettes to be handled collectively in changing the components is the seriate number of cassettes for supplying the components to the objective working machine. Therefore, the collective change of cassettes for the change and supply of the components to be supplied to the objective working machine can be achieved at once in a short time. According to the 4th aspect of the invention, the seriate number is a unit division seriate number of the seriate number of the cassettes for supplying components to the objective working machine. Therefore, even when the seriate number of cassettes for supplying components to the objective working machine is great, the collective change work can be easily achieved in several installments.

According to the above construction of the method for collectively changing components at a component supply section of the 5th aspect of the invention, based on any one of the 1st through 4th aspects of the invention, when the transfer rack is changed at the component supply section, this is automatically detected. Then the propriety of the component in each component supply cassette loaded in the transfer rack after the change is automatically determined upon the detection. Therefore, the propriety of the component after the change is not required to be decided manually each time. This prevents the possible deficiency of the objective product supplied with improper components and the objective work due to the inexecution, neglect or failure of the determination. Consequently, the quality can be stabilized and the yield can be increased.

According to the above construction of the method for collectively changing components at a component supply section of the 6th aspect of the invention, based on the 5th aspect of the invention, the determination of the propriety is further executed on all the component supply cassettes. Therefore, such a failure as the supply of improper components can be prevented in regard to every one of the components changed collectively.

According to the above construction of the method for collectively changing components at a component supply section of the 7th aspect of the invention, based on either one of the 5th and 6th aspects of the invention, the determination of the propriety of each component in collectively changing components in a number of component supply cassettes by the transfer rack is executed based on the component information stored in the transfer rack. Accordingly, there is no need to store the component information in every component supply cassette, and it is only required to intensively store the component information by storing it or executing a similar operation in a storage means at the transfer rack that handles them collectively. Therefore, the positioning can be executed once also by reading the component information of each component supply cassette, and this is convenient and increases the operation speed.

According to the above construction of the method for collectively changing components at a component supply section of the 8th aspect of the invention, based on any one of the 5th through 7th aspects of the invention, the component information is stored in the storage means which is capable of reading and writing. Therefore, even when the type of component to be handled is changed, the method can cope with it, and information regarding the number of components to be used and the number of remaining components consequent upon the component supply and the like can be managed together.

According to the above construction of the apparatus for collectively changing components at a component supply section of the 10th aspect of the invention, similarly to the 1st and 9th aspects of the invention, the transfer rack loaded with the component supply cassettes so that they can be positioned, loaded and unloaded can be surely positioned in a short time without individual differences in the two directions by using the automatic positioning means at the component supply section. Furthermore, the truck can retain the, received transfer rack by using the retaining means. Therefore, the truck can easily and speedily handle the transfer rack without the transfer rack falling off when it is carried on the truck. Furthermore, the transfer rack is adjusted in height on the truck, so that when passing the transfer rack between the truck and the component supply section, both of them coincide with each other in height. Therefore, the transfer rack can be loaded and unloaded easily and smoothly.

According to the above construction of the apparatus for collectively changing components at a component supply section of the 11th aspect of the invention, based on the 10th aspect of the invention, the relation in height between the component supply section and the transfer rack support section can be further determined by the detection means. Therefore, the relation in height between the component supply section and the transfer rack supported on the truck can be made to coincide with each other easily and correctly so that the transfer rack can pass between them smoothly.

According to the above construction of the apparatus for collectively changing components at a component supply section of the 12th aspect of the invention, based on either one of the 10th and 11th aspects of the invention, the component supply section easily achieves the delivery of the transfer rack to the specified position because the front end portion of the transfer rack is made to be received against the front end portion receiving member of the positioning means. The state of delivery to the specified position can be surely retained by the positioning of the transfer rack in the direction in which it is loaded and unloaded between the first pressure member and the front end portion receiving member. By further retaining the transfer rack between the second pressure member and the side surface receiving member in the direction perpendicular to the direction in which it is loaded and unloaded, the transfer rack can be surely positioned in the position specified by the side surface receiving member.

According to the above construction of the component supply apparatus of the 13th aspect of the invention, based on the 12th aspect of the invention, the first pressure member comprises a lever member. By this arrangement, the first pressure member can be made to easily retreat from the loading/unloading path of the transfer rack when it is t in use so that it exerts no influence on the loading and unloading operations. The second pressure member comprises an eccentric shaft, and it is placed in a position where it exerts no influence on the loading and unloading of the transfer rack. The second pressure member surely positions the transfer rack that is delivered to the specified position its eccentric operation at need in the direction perpendicular to the direction in which the transfer rack loaded and unloaded, and the positioning can be leased.

According to the above construction of the apparatus for collectively changing components at a component supply section of the 14th aspect of the invention, based on either one of the 12th and 13th aspects, the portions of the transfer rack in contact with the front end portion receiving member and the first pressure member are each implemented by a roller member. Even in a state in which the transfer rack is securely positioned between them in the direction in which it is loaded and unloaded, the movement of the transfer rack in the direction perpendicular to the direction in which it is loaded and unloaded is tolerated by the rolling of the roller member. With this arrangement, the positioning of the transfer rack in the direction perpendicular to the direction in which it is loaded and unloaded by the front end portion receiving member and the second pressure member not hindered so as to allow the correct positioning to be rely achieved.

According to the above construction of the apparatus for collectively changing components at a component supply section of the 15th aspect of the invention, based on any one of the 9th through 14th aspects, the component supply section further guides the loading and unloading of the transfer rack with play from both sides by means of the guide rollers. With this arrangement, the transfer rack is allowed to be easily loaded and unloaded without serious rattling or directional disorder with a margin given to the operation of loading and unloading the transfer rack. In the state in which the transfer rack is delivered to the specified position, no serious displacement occurs in position and posture. With this arrangement, the transfer rack can be smoothly positioned while being corrected in the specified position and posture.

According to the above construction of the apparatus for collectively changing components at a component supply section of the 16th aspect of the vention, based on any one of the 9th through 15th aspects the invention, the component supply section surely retains the received transfer rack in the positioning support section so as to allow the transfer rack to be surely positioned at a specified height. In loading and unloading the transfer rack, the loading/unloading guide section guides the loading and unloading of the transfer rack by momentarily lifting the transfer rack from the positioning support section. With this arrangement, the transfer rack is loaded and unloaded without being influenced by the secure support structure for the positioning, and the positioning support section can be prevented from wearing in an early stage.

According to the above construction of the apparatus for collectively changing components at a component supply section of the 17th aspect of the invention, based on any one of the 9th through 16th aspects, an effect similar to that of the 5th aspect of the invention can be produced by any of the component information stored in the storage means provided at the transfer rack or each component supply cassette supported on the storage rack.

According to the above construction of the apparatus for collectively changing components at a component supply section of the 18th aspect of the invention, based on the 17th aspect of the invention, the mode selecting means selects between a variety of decision modes such as a mode of not deciding the propriety of each component, a mode of deciding all component supply cassettes and a mode of deciding only required ones. Therefore, the possible wasteful decision of the propriety of components can be prevented by the selection according to the actual circumstances.

According to the above construction of the apparatus for collectively changing components at a component supply section of the 19th aspect of the invention, based on either one of the 17th and 18th aspects of the invention, the component information is stored in the storage means capable of reading and writing as in the 8th aspect of the invention. Therefore, even when the component to be handled is changed, the apparatus can cope with it, and information regarding the number of components to be used and the number of remaining components due to the component supply and the like can be managed together.

According to the above construction of the transfer rack of the 20th aspect of the invention, when collectively handling the components that are positioned and supported in the specified number of component supply cassettes for the change, the decision of the propriety of the components after the change is executed by the component information stored in the transfer rack itself similar to the 7th aspect of the invention. With this arrangement, there is no need to store the component information in every component supply cassette, and the component information is only required to be intensively stored as stored in one storage means. Therefore, the positioning can be executed once also in reading the component information of each component supply cassette, and this is convenient and increases the operation speed.

According to the above construction of the truck of the 21st aspect of the invention, the transfer rack loaded with a specified seriate number of component supply cassettes can be put on the truck so that the transfer rack can be easily taken in and out by the guide means. While retaining the transfer rack with the retaining means to prevent it from falling off, the truck can run smoothly on the running wheels provided at its main body so as to move freely.

According to the above construction of the truck of the 22nd aspect of the invention, based on the 21st aspect of the invention, the stopper means is further operated to prevent the movement of the main body on the running wheels and stabilize the main body in the specified position. With this arrangement, the collective change of a number of component supply cassettes by the transfer rack at the component supply section and the change section can be easily and stably achieved without any trouble.

According to the above construction of the truck of the 23rd aspect of the invention, based on either one of the 21st and 22nd aspects of the invention, when the truck is put in the specified positional relation with the component supply section of the objective working machine, the component supply section is further connected with the main body by the connecting means to allow the positional relation between them to be surely retained. Therefore, the operation of changing a heavy transfer rack loaded with a number of component supply cassettes can be achieved easily and smoothly without any trouble such as hitching.

BRIEF DESCRIPTION OF DRAWINGS

Before the description of the present invention proceeds, it is to be noted that like parts are designated by like reference numerals throughout the accompanying drawings.

FIGS. 15A and 15B are a side view and an explanatory view showing a working stage of adjusting in height a transfer rack support section at the truck positioned from the state shown in FIG. 14 and a detection state of a height detecting means in this stage;

DETAILED DESCRIPTION OF THE INVENTION

Figure 1:
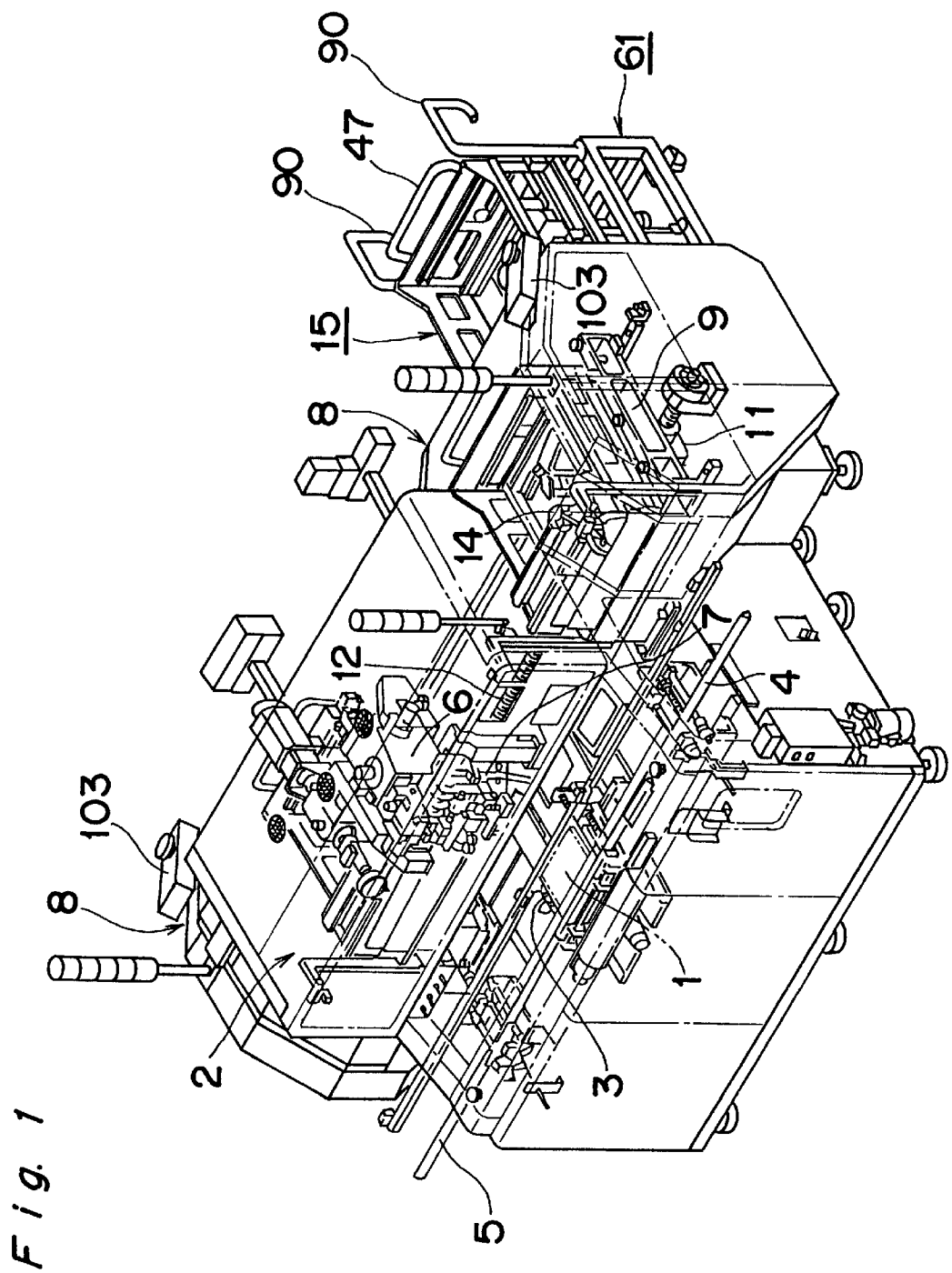
FIG. 1 is a perspective view of a mounter for mounting electronic components onto an electronic circuit board to which the method and apparatus for collectively changing components at a component supply section and a truck thereof is applied according to a first embodiment of the present invention.

Before the description of the present invention proceeds, it is to be noted that like parts are designated by like reference numerals throughout the accompanying drawings.

A method and apparatus for supplying components according to an embodiment of the present invention will be described below with reference to FIGS. 1 through 22.

The present embodiment is described based on a case where electronic components are supplied to a mounter 2 which serves as an objective working machine for mounting electronic components on an electronic circuit board 1 as shown in FIG. 1.

As shown in FIG. 1, in order to mount electronic components in required portions of the electronic circuit board 1, the present mounter 2 receives and places the electronic circuit board 1 on its X-Y table 3 at its fore part, and the X-Y table moves in two directions of X and Y that are perpendicular to each other. The X-Y table successively moves an electronic component mounting position to its component mounting position to allow the electronic components to be mounted.

At both lateral sides of the X-Y table 3 are provided a loading mechanism 4 and an unloading mechanism 5 for loading the electronic circuit board 1 prior to the electronic component mounting process onto the X-Y table 3 and for unloading the electronic circuit board 1 mounted with the electronic components on the X-Y table 3.

Behind the X-Y table 3 is provided a component mounting head 6 for mounting electronic components on the electronic circuit board 1. The component mounting head 6 is equipped, for example, with a plurality of suction nozzles 7 on a turntable (not shown) so that it can suck by the suction nozzle 7 each electronic component supplied at the component supply section 8 provided further behind the component mounting head 6 to hold it. The mounting head 6 then mounts the electronic component in a specified position defined as the component mounting position of the electronic circuit board 1 on the X-Y table 3 located at the fore part.

Figure 2:
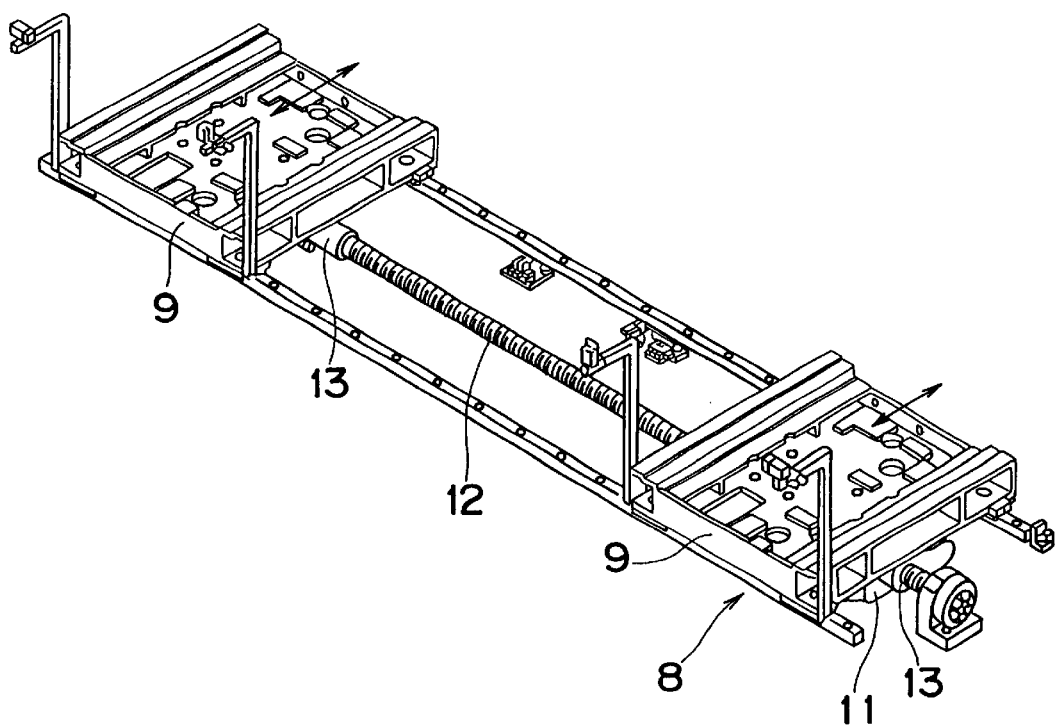
FIG. 2 is a perspective view showing a transport stand section for performing a selective supply of components at two component supply sections provided at the mounter shown in FIG. 1.
Figure 3:
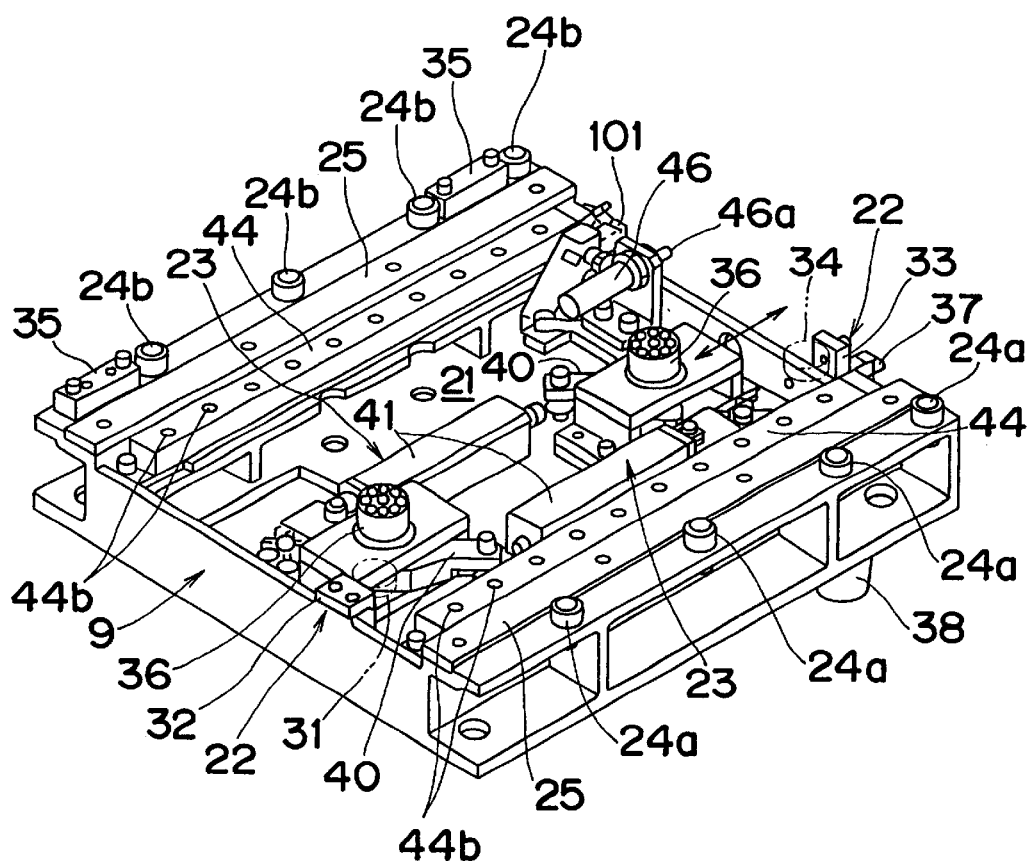
FIG. 3 is a detailed perspective view of the transport stand section shown in FIG. 2.

In the present embodiment, the component supply section 8 is provided laterally in two places, and when one of the placess is put in a component supply operation state, the other can be put in a standby state. Each component supply section 8 has a transport stand 9 having a rectangular plan configuration as shown in FIGS. 1 through 3 and a hollow servomotor 11 fixed to it. By rotatively driving a hollow motor shaft 13 engaged with a ball thread shaft 12 of the servomotor 11, the transport stand 9 is moved laterally along the ball thread shaft 12. The servomotor 11 of the component supply section 8 on the operative side supplies the components, while the servomotor 11 of the component supply section 8 on the inoperative side is kept in the standby state.

In order to supply the electronic components to the mounter 2, the transport stand 9 uses a transfer rack 15 as shown in FIGS. 1, 5, and 8 through 11. The transfer rack 15 is equipped with a required number of conventionally known component supply cassettes 14 (FIG. 11) which feed electronic components, one by one, and the transfer rack 15 is also able to be positioned, loaded and unloaded. The transfer rack 15 is provided with a Z-table structure that has been owned by the conventional component supply section, i.e., a structure for supporting a number of component supply cassettes 14 in series in the sidewise direction so that the cassettes can be positioned, loaded and unloaded.

According to the present embodiment, in compliance with the use of the component supply cassette 14 for taping components, the transfer rack 15 has a box-shaped main body frame 16 as shown in FIGS. 5 through 11. Above the fore part of the main body frame 16, a component feeding section 14a of the component supply cassette 14 is received by support rails 18a and 18b provided depthwise in two places as regulated at an appropriate height. The depthwise and lateral positional relations are regulated by engaging its positioning hole 20a with a positioning pin 20b of the component supply cassette 14. Further, the component supply cassette 14 is supported by corrugated guides 19a and 19b at two depthwise portions of its reel setting section 14b provided at a hind part, thereby preventing the possible transverse vibration.

Figure 11:
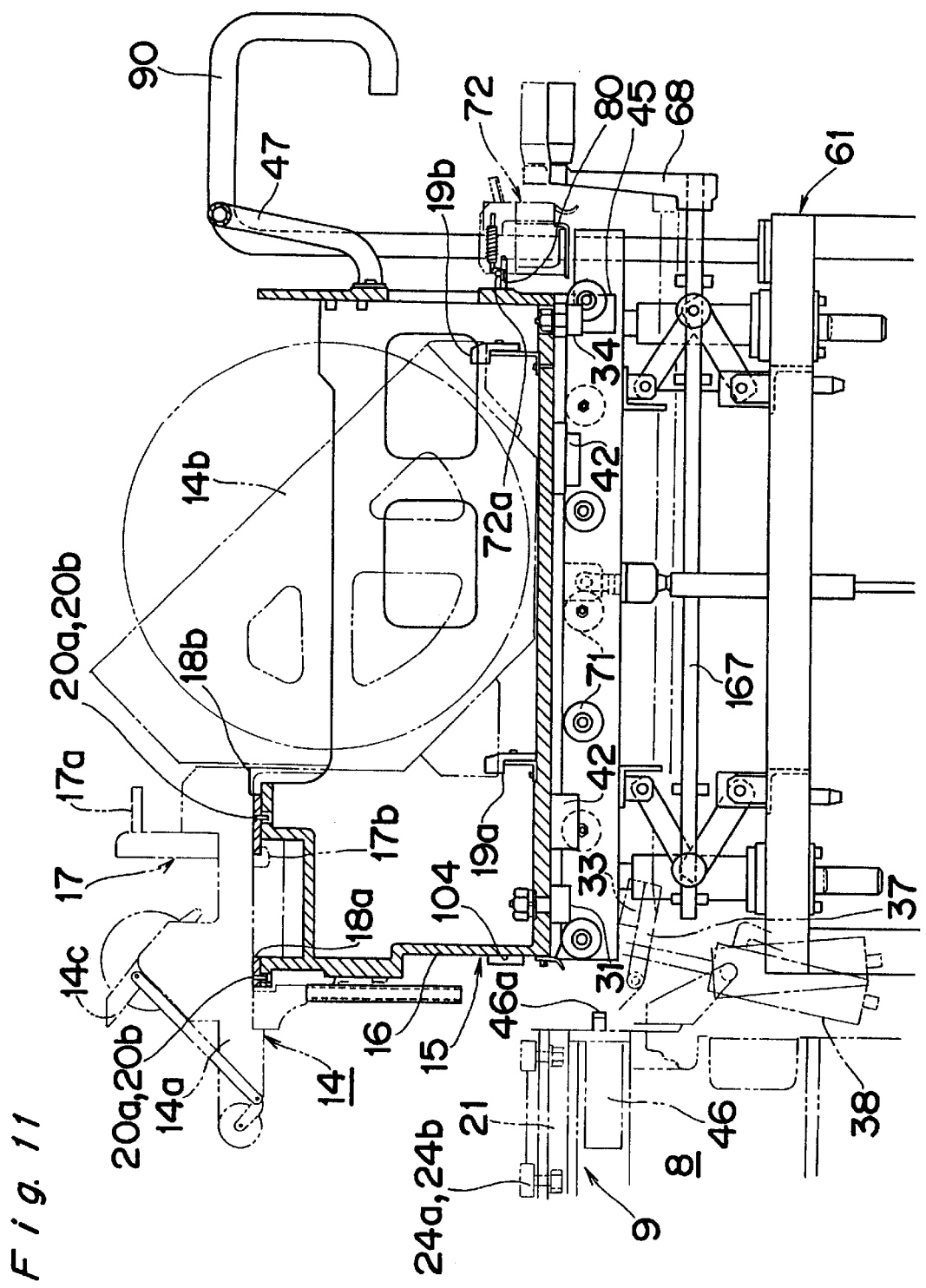
FIG. 11 is a sectional view showing a support section of the truck for supporting the transfer rack shown in FIG. 8.

Such a positioning and retaining state can be securely retained by engaging a clamp hook 17b with the support rail 18b by operating a clamping lever 17a of a clamp mechanism 17 shown in FIG. 11. By releasing the above engagement, the positioning and retaining of the component supply cassette 14 is released to allow an individual component supply cassette 14 to be removed. Therefore, each component supply cassette 14 can be changed at the transfer rack 15.

The present embodiment is equipped with, for example, 60 seriated component supply cassettes 14 required for supplying components to the mounter 2 or the objective working machine at the component supply section 8 so that the cassettes 14 can be positioned, loaded and unloaded.

The transport stand 9 receives the transfer rack 15 that is loaded with the component supply cassettes 14 so that the cassettes 14 can be individually positioned, loaded and unloaded in such a manner that the transfer rack 15 can be totally positioned as made removable, and the electronic components can be selectively supplied from the component supply cassette 14 to the mounter 2 with the transfer rack 15. For the selective supply of the electronic components, the transport stand 9 at the component supply section 8 in the operating state is moved laterally by a servomotor 11 so that the component supply cassette 14 that can supply the required electronic components is moved to the component supply position of the component mounting head 6.

The component mounting head 6 operates the component supply cassette 14 to receive one electronic component every time it presses an operating lever 14c of the component supply cassette 14 on its own initiative in a known manner. The mounting head then sucks and holds the electronic component by the corresponding suction nozzle 7 and mounts it on the electronic circuit board 1.

Figure 4:
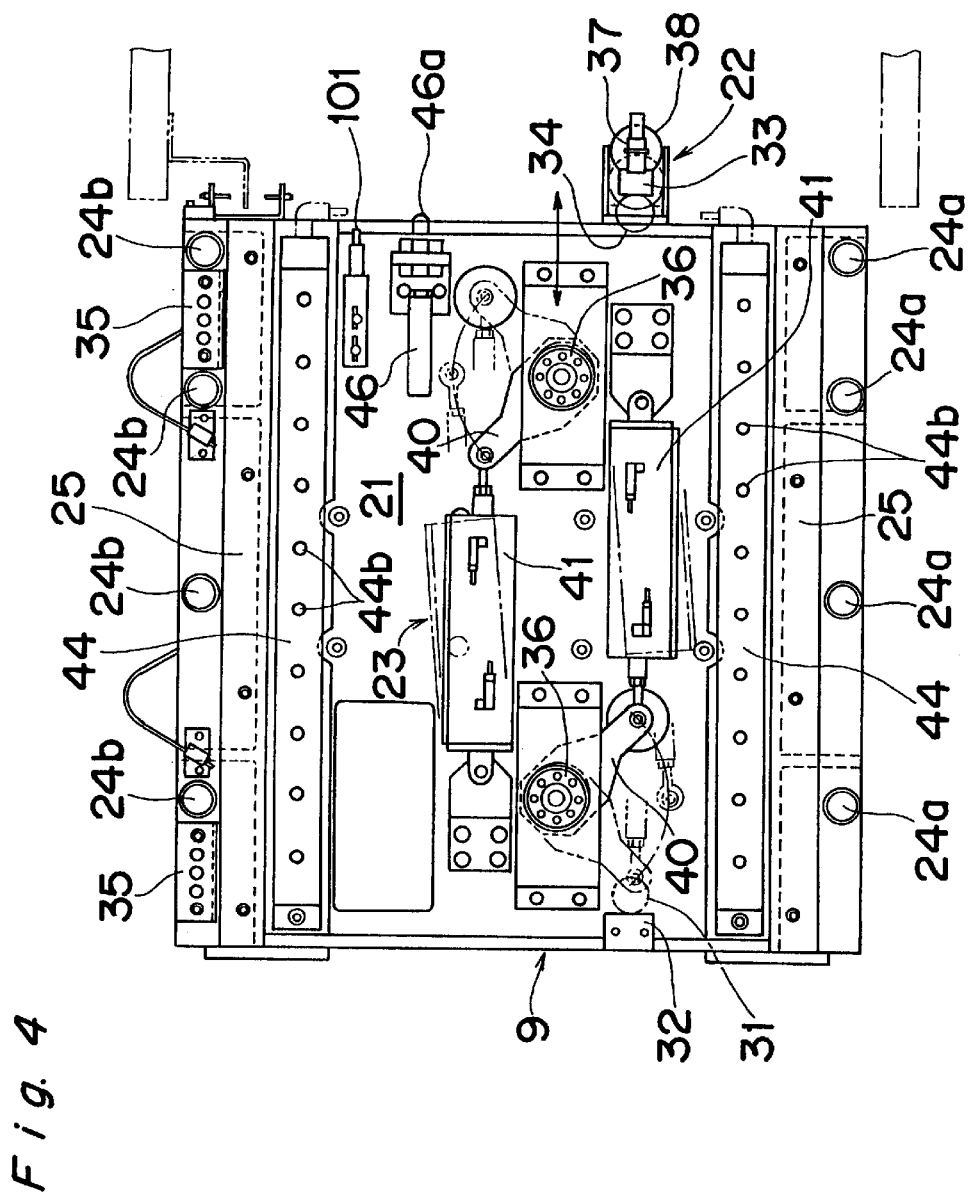
FIG. 4 is a detailed plan view of the transport stand section shown in FIG. 2.

In regard to each of the component supply cassettes 14 positioned and retained individually at the transfer rack 15, the required one must be positioned correctly in the component supply position by the lateral movement of the transport stand 9. It is also required to correctly position the transfer rack 15 on the transport stand 9. Therefore, in a loading/unloading path 21 of the transport stand 9 where the transfer rack 15 is loaded and unloaded as shown in FIGS. 2 through 4, a first positioning means 22 operating in the direction in which the transfer rack is loaded and unloaded and a second positioning means 23 operating in a direction perpendicular to the direction in which the transfer rack is loaded and unloaded are provided. Aside from the positioning means 22 and 23, a plurality of guide rollers 24a and 24b for guiding the transfer rack 15 on the lateral sides are provided to facilitate a smooth loading and unloading of the transfer rack 15 without twisting or hitching the transfer rack.

Figure 6:
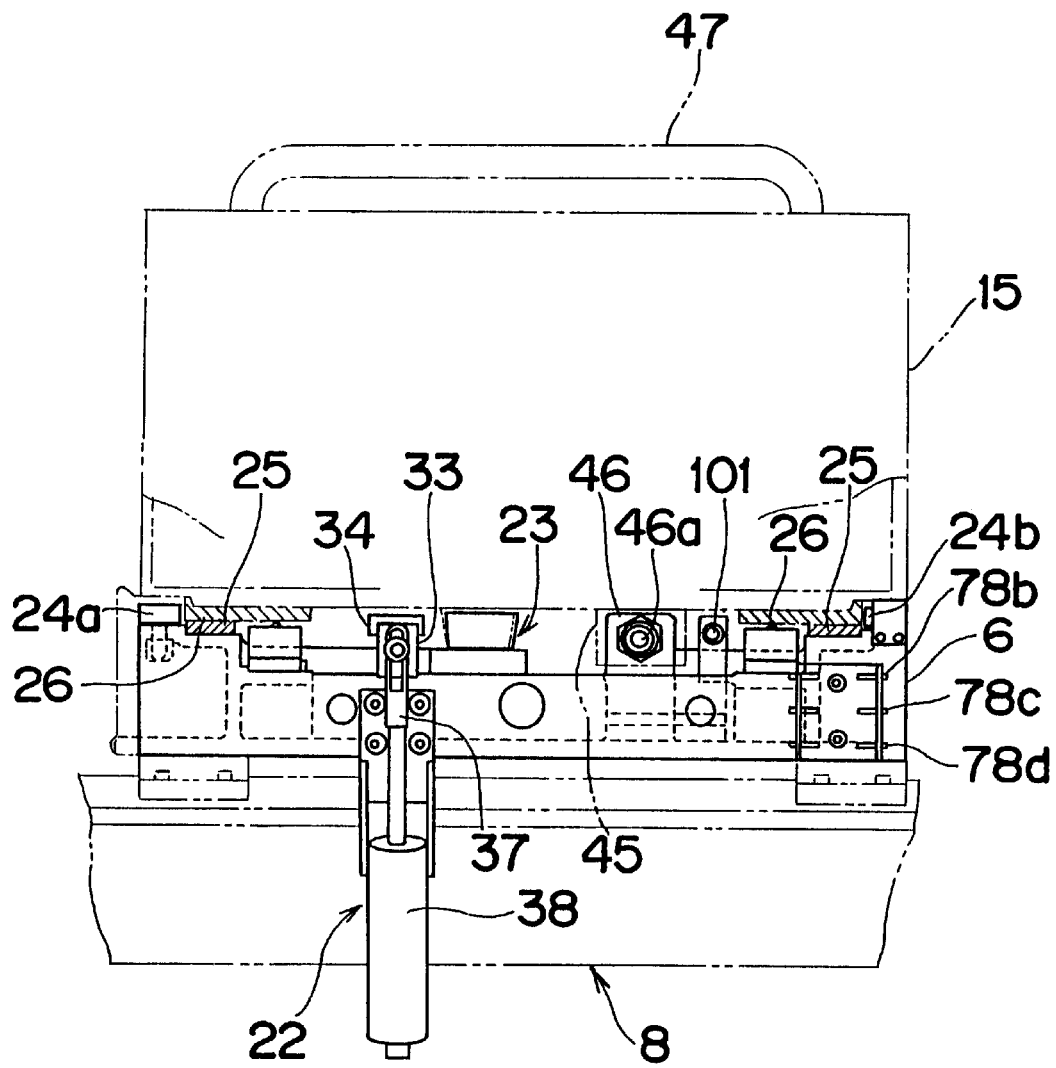
FIG. 6 is a front view of a transfer rack positioned on the transport stand shown in FIG. 1.
Figure 7A:
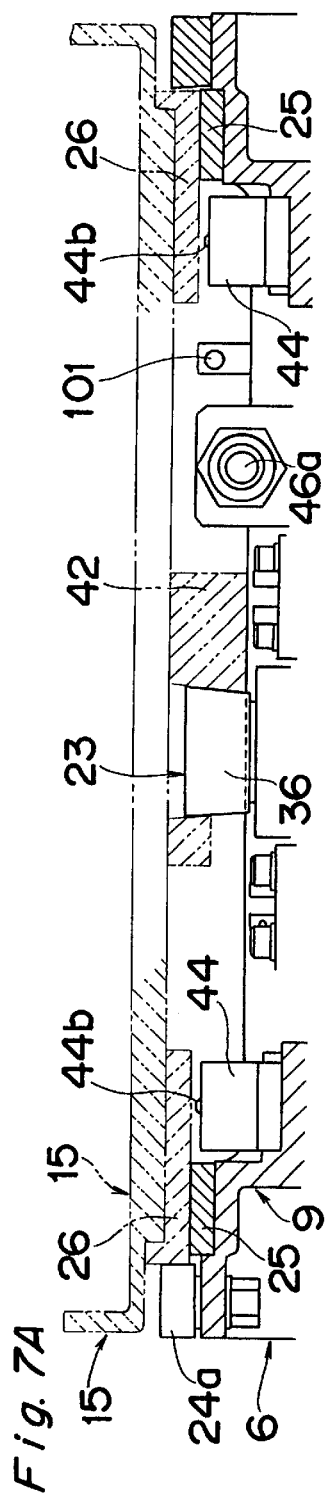
FIGS. 7A, 7B, and 7C are sectional views showing a sequence of operations of positioning and releasing the transfer rack on the transport stand shown in FIG. 1.
Figure 7B:
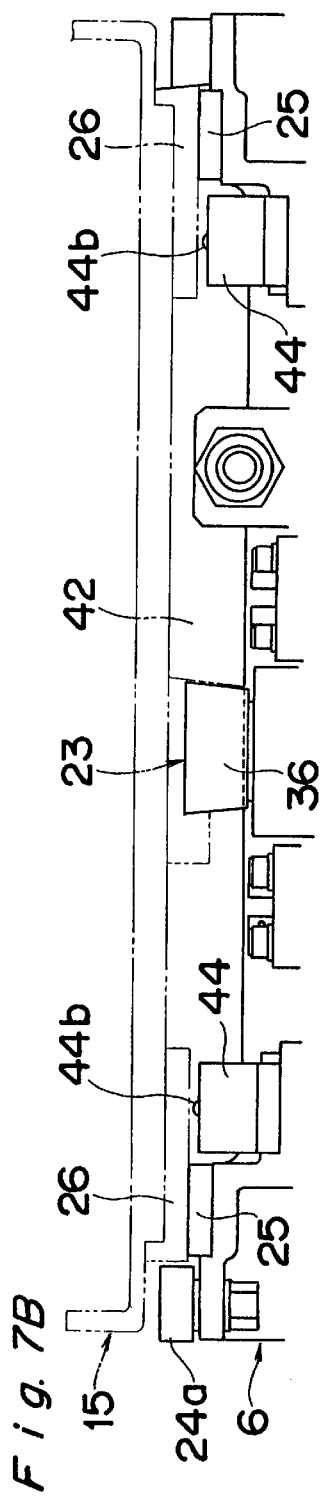
Figure 7C:
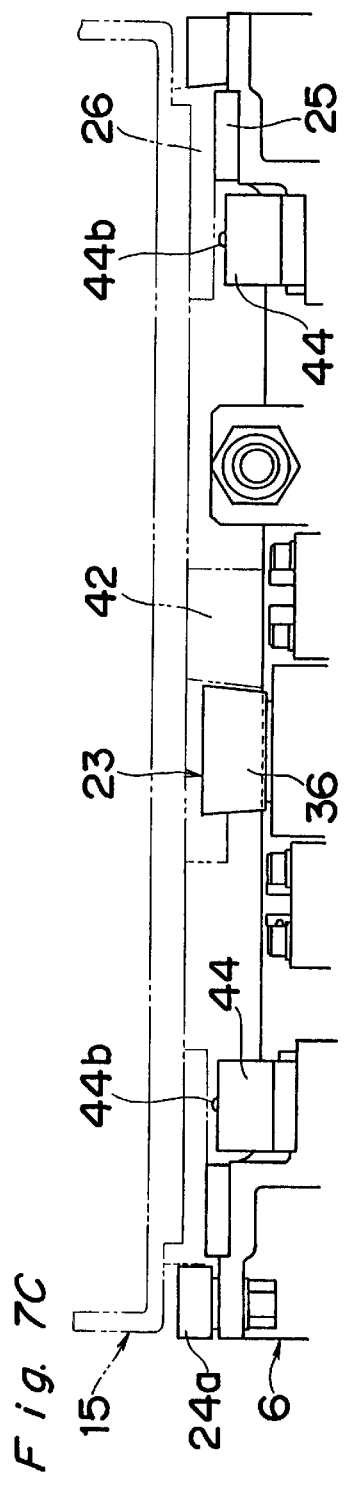

Further, dimensional adjustment and positioning are performed with high accuracy so that the support height of the transfer rack 15 is correct. Rail members 25 each made of a material having an excellent abrasive resistance are provided to receive rail members 26 provided likewise at the transfer rack 15 as shown in FIGS. 6 and 7. The transfer rack 15 is also guided on the lateral sides by guide rollers 24a and 24b at the rail members 26, so that it can be smoothly loaded and unloaded.

As shown in FIGS. 3, 4 and 6, the first positioning means 22 is comprised of a receiving block 32 for receiving at a specified receiving position a positioning roller 31 (FIGS. 3, 10, and 11) provided at the front end portion of the delivered transfer rack 15. The first positioning means also comprises pressure block 33 for positioning the transfer rack 15 in the direction in which the transfer rack 15 is loaded and unloaded by pressing the transfer rack 15 against the receiving block 32 from behind via a positioning roller 34 provided at the hind portion of the transfer rack 15 to hold the transfer rack 15 between them.

The pressure block 33 is supported by a combination lever mechanism 37. By advancing and retreating the pressure block 33 by an air cylinder 38, the pressure block 33 is put in either a position in which it protrudes into the loading/unloading path 21 as shown in FIG. 3 to perform the positioning, or is put in a position in which it retreats below the loading/unloading path 21 as indicated by imaginary lines in FIGS. 10 and 11 in order to release the positioning.

In the retreating position, the pressure block 33 does not disturb the loading and unloading of the transfer rack 15 in the loading/unloading path 21.

Figure 5:
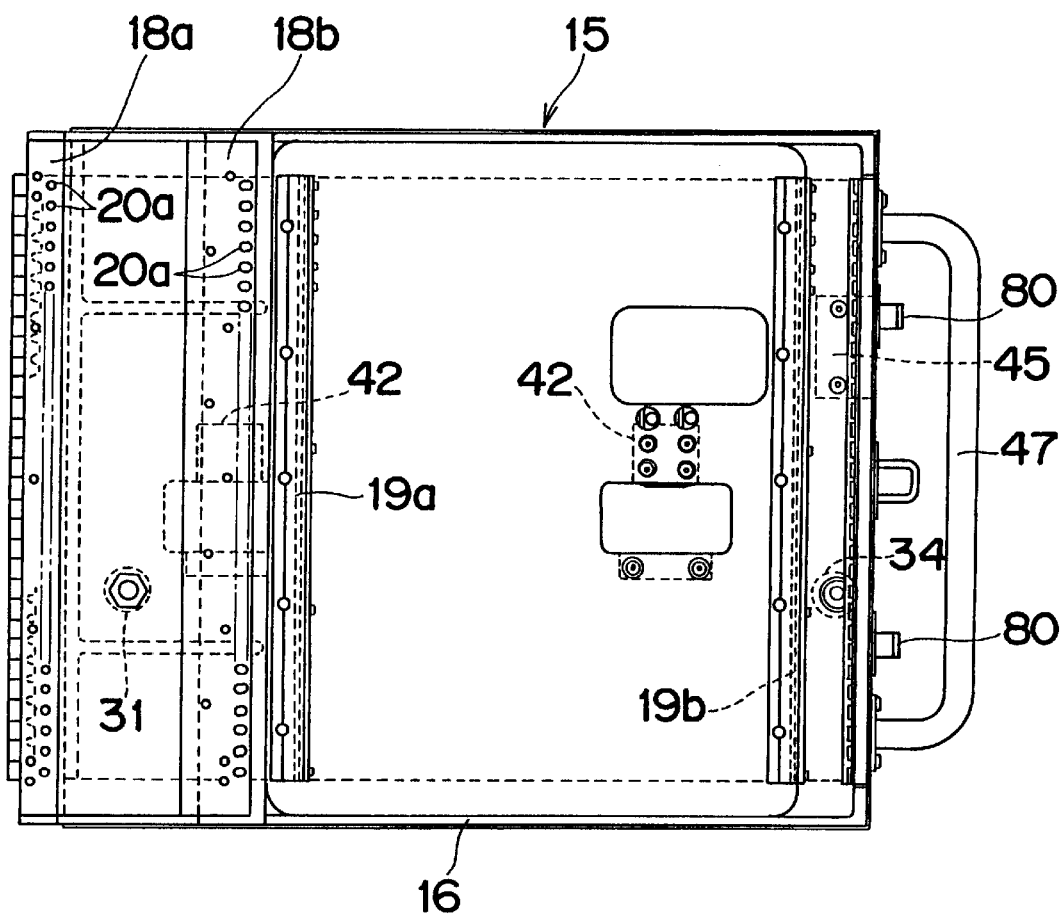
FIG. 5 is a plan view of a truck used in combination with the mounter shown in FIG. 1.

As shown in FIGS. 5 through 7, the second positioning means 23 is comprised of one-side receiving blocks 35 which receive the transfer rack 15 in a specified position at a side of the loading/unloading path 21 and roller type eccentric shafts 36 which press the transfer rack 15 against the one-side receiving blocks 35 at the other side to hold the transfer rack 15 between them to position the transfer rack 15 in a direction perpendicular to the direction in which the transfer rack 15 is loaded and unloaded. The eccentric shafts 36 are provided laterally in two places approximately at the center of the loading/unloading path 21 in FIG. 4 as pivotally driven via levers 40 by air cylinders 41 provided specially for them. The eccentric shafts 36 operate to press aligning blocks 42 provided on a bottom lower surface of the transfer rack 15 and release the pressure, thereby performing the positioning and releasing the positioning.

The guide rollers 24a and 24b guide the transfer rack 15 that is loaded or unloaded laterally with a slight play. The rollers located on the side of the transport stand 9 with the one-side receiving block 35 are positioned slightly outwardly of the block so that they do not disturb the positioning of the transfer rack 15 by the second positioning means 23 using the one-side receiving block 35.

The eccentric shaft 36 protrudes in the loading/unloading path 21. However, it has such a structure that the bottom lower surface of the transfer rack 15 does not interfere with it in the loading or unloading operation in the loading/unloading path 21. The aligning block 42 is correctly positioned and has excellent abrasive resistance so that the positioning can be correctly achieved.

If the transfer rack 15 is loaded and unloaded with the rail members 25 of the transport stand 9 put in contact with the rail members 26 of the transfer rack 15, their abrasion resistances operate to hinder smooth loading and unloading of the transfer rack 15, and also cause abrasion of the rail members 25 and 26 in an early stage. Therefore, in order to avoid these troubles, the present embodiment is provided with free flow conveyors 44 arranged inside the rail members 25 in parallel with them, as shown in FIGS. 3, 4, 6, and 7.

The free flow conveyor 44 is laterally, in FIG. 4, provided with a plurality of guide protrusions 44b which are made to protrude and retreat by an air operation on its upper surface. When the guide protrusions 44b protrude upward, they push up the rail members 26 of the transfer rack 15 to lift them above a rail member 25. By receiving the transfer rack 15 in an air-cushion like light contact state at the upper ends of a number of guide protrusions 44b, the transfer rack 15 can be loaded and unloaded smoothly and silently with reduced abrasive resistance.

The transport stand 9 is further provided with an air cushion cylinder 46 which abuts against a block 45 fixed to the transfer rack 15 immediately before the transfer rack 15 is delivered to a specified position and received by the receiving block 32 as abutted against it (FIGS. 3, 4, 6, and 11) and operates to alleviate an impact when the transfer rack 15 is delivered by means of an actuator 46a. At a hind part of the transfer rack 15 is provided a handle 47 for loading and unloading it.

In order to change the transfer rack 15 loaded with a number of the component supply cassettes 14 at the transport stand 9 of the component supply section 8, a truck 61 as shown in FIGS. 8 through 12 is used. This truck 61 has a frame-shaped main body 63 having running wheels 62. The main body 63 is provided with a transfer rack support section 65 that is adjusted in height by toggle mechanisms 64. The height adjustment is performed with the transfer rack 15 retained in the transfer rack support section 65 to perform level adjustment with the transport stand 9 of the component supply section 8. Therefore, the transfer rack 15 can be securely passed without hitching or the like.

The transfer rack support section 65 is supported and guided so that guide rods 66 provided depthwise in two places can be moved up and down by guide pipes 67 provided at a fore part and a hind part of the main body 63. The toggle mechanism 64 is provided between the main body 63 and the transfer rack support section 65, and the toggle mechanism 64 is extended or contracted by turning a screw shaft 167 by a handle 68 to move the transfer rack 65 up and down. Therefore, by extending and contracting the toggle mechanism 64 by the handle 68, the transfer rack 15 can be adjusted in height.

As shown in FIGS. 9 through 12, the transfer rack support section 65 has a frame-like shape and is provided with guide rollers 71, on both of the frames 69. The guide rollers 71 receive the transfer rack 15 from below at the rail members 26 to facilitate the loading and unloading of the transfer rack 15. However, the transfer rack support section 65 retains the transfer rack 15 in a specified position by connecting buckles 72a of retainers 72 with metal hooks 80 of the transfer rack 15, so that the transfer rack 15 is prevented from falling off. With this arrangement, the truck 61 can be freely moved with the transfer rack 15 carried thereon. Furthermore, the transfer rack support section 65 has side guides 70 that are made of a material such as synthetic resin having a good sliding performance and operate to guide the transfer rack 15 put on them. Thus, the possible rattling of the transfer rack 15 when the truck 61 is moving can be sufficiently prevented.

Furthermore, in order to change the transfer rack 15 at the transport stand 9 of the component supply section 8, it is required to stabilize the transfer rack 15 in a specified position. In order to satisfy this requirement, a stand stopper 73 is provided at a portion of the main body 63 which can be moved up and down by a foot pedal 74. When the stand stopper 73 is lowered, it abuts against the floor surface to stretch between the main body 63 and the floor surface, thereby preventing the main body 63 from moving with the running wheels 62. When the stand stopper 73 is raised, the stretch between the main body 63 and the floor surface is released so as to allow the main body 63 to freely move with the running wheels 62. The truck 61 is provided with handles 90 for the movement.

Furthermore, the truck 61 and the component supply section 8 are provided respectively with a connecting bracket 75 and a connecting rod 76 which connect together when the truck 61 is put in a specified positional relation with the transport stand 9 of the component supply section 8. The connecting rod 76 is made to advance and retreat by an air cylinder 77 to effect the connection and release of the connection.

Furthermore, whether or not the transfer rack support section 65 and the transport stand 9 of the component supply section 8 coincide with each other in support height with respect to the transfer rack 15 is important because it determines whether or not the passing of the transfer rack 15 between them can be performed smoothly without hitching or twisting. Therefore, the present embodiment is provided with a height detecting means 78 for deciding whether the transfer rack support height of the transfer rack support section 65 of the truck 61 is equal to, higher than, or lower than the support height of the transfer rack 15 at the transport stand 9 between the truck 61 and the component supply section 8. With this arrangement, the height adjustment of the transfer rack support section 65 by the toggle mechanisms 64 can be achieved properly in a short time.

Figure 12:
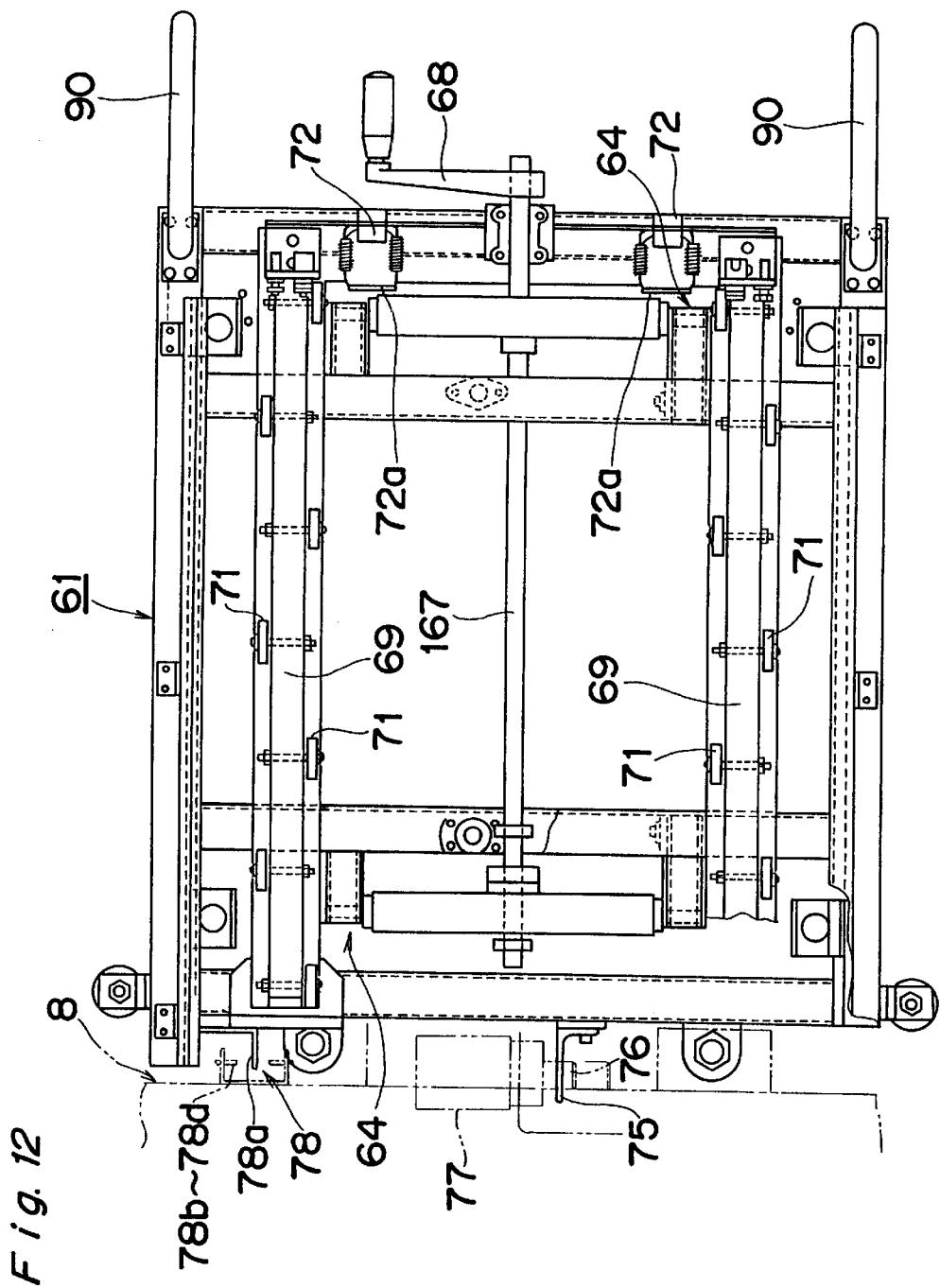
FIG. 12 is a plan view of the truck.

As shown in FIGS. 4, 6, and 12, the height detecting means 78 is comprised of a slit plate 78a provided at the transfer rack support section 65 and photocouplers 78b through 78d which detect whether the height of the slit plate 78a is higher than, lower than or at the set height in three steps.

An example of a procedure for executing the collective change of the component supply cassettes 14 at the component supply section 8 will be described below.

Figure 13:
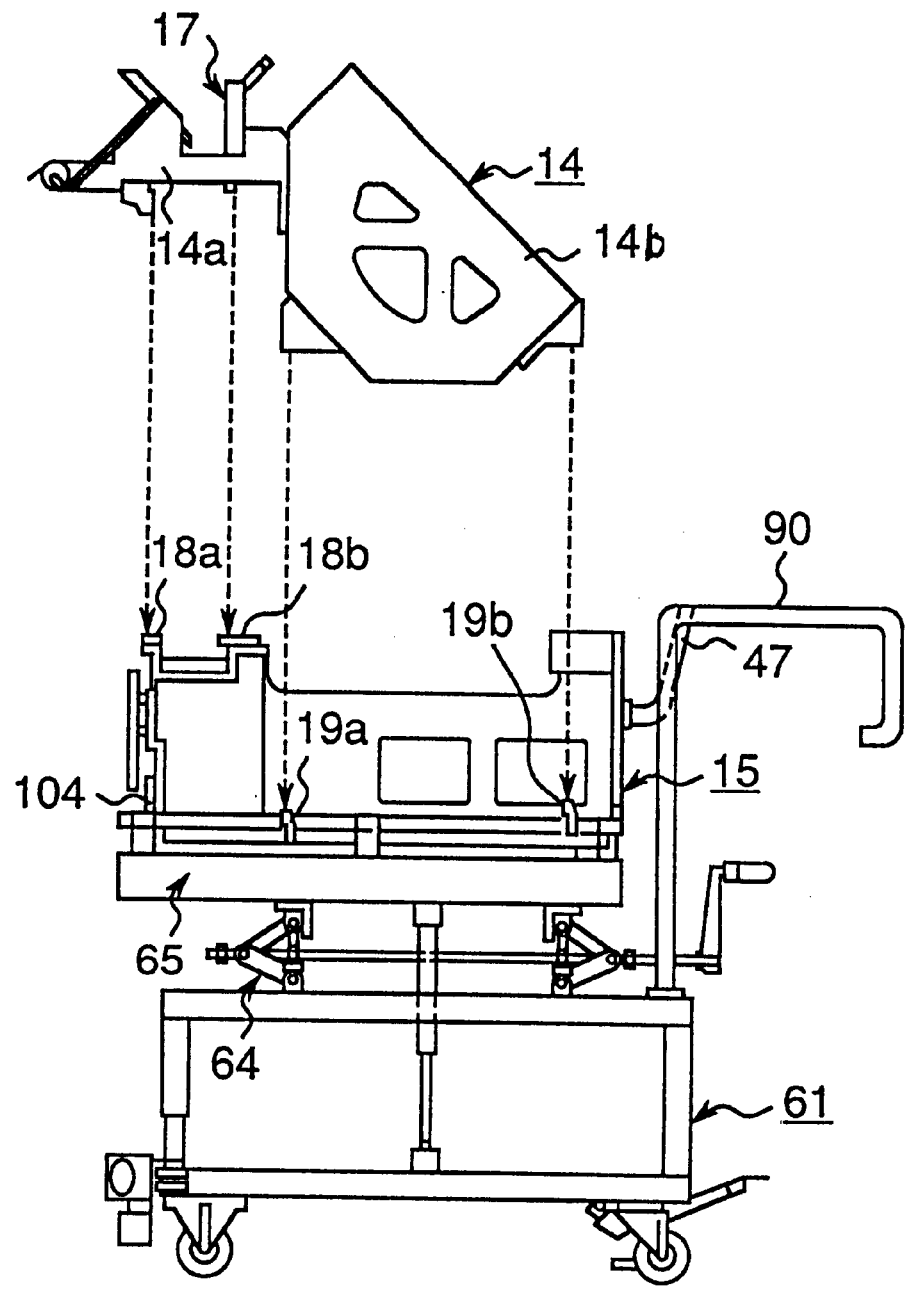
FIG. 13 is a side view showing a working stage of positioning and supporting a component supply cassette on the transfer rack on the truck.

First, in parallel with the supply of components, at the component supply section 8 of the mounter 2 shown in FIG. 1, the transfer rack 15 put on the truck 61 as shown in FIG. 13 is loaded with a required number of component supply cassettes 14 so that the cassettes can be individually positioned, loaded and unloaded to prepare for the subsequent component change. Therefore, to supply depleted components, a component supply cassette 14 storing therein the same component as the component that is currently supplied at the component supply section 8 is to be loaded. To change the type of components, a component supply cassette 14 storing therein new components for the change is to be loaded.

In the present embodiment, while one of two component supply sections 8 is supplying components, the other is in the standby state. Therefore, when the component supply section 8 to be put in the standby state when the component supply cassette 14 is depleted at the transfer rack 15 loaded in the component supply section 8, or when the component to be supplied in the subsequent component supply stage is to be changed and requirement of supply or change of the components is detected and displayed, the transfer rack 15 at the component supply section 8 put in the standby state is taken out and replaced by a transfer rack 15 loaded with new component supply cassettes 14. Thus, the collective change of components is executed. The collective change by the transfer rack 15 at the component supply section 8 can be detected by a microswitch 101 as shown in FIGS. 3, 4, 6, and 7 provided at the transport stand 9. Based on this detection, the propriety of the components after the collective change is automatically determined. It is to be noted that the decision can be executed on the components loaded initially collectively in the transfer rack 15.

When the transfer rack 15 is delivered to the transport stand 9 and loaded, the microswitch 101 is pressed so as to be turned on to detect the loading of transfer rack 15. When the transfer rack 15 is withdrawn from the transport stand 9 so as to removed, the pressure from the transfer rack 15 is released to be turned off to detect the removal of the transfer rack 15. With the change of the sate of the microswitch 101 from the non-detection state to the detection state in regard to the transfer rack 15, the occurrence of the loading of the transfer rack 15 can be decided. With a shift of the state of the transfer rack 15 from the detection state via the non-detection state to the detection state again, the occurrence of the collective change of components by the transfer rack 15 can be determined.

Figure 23:
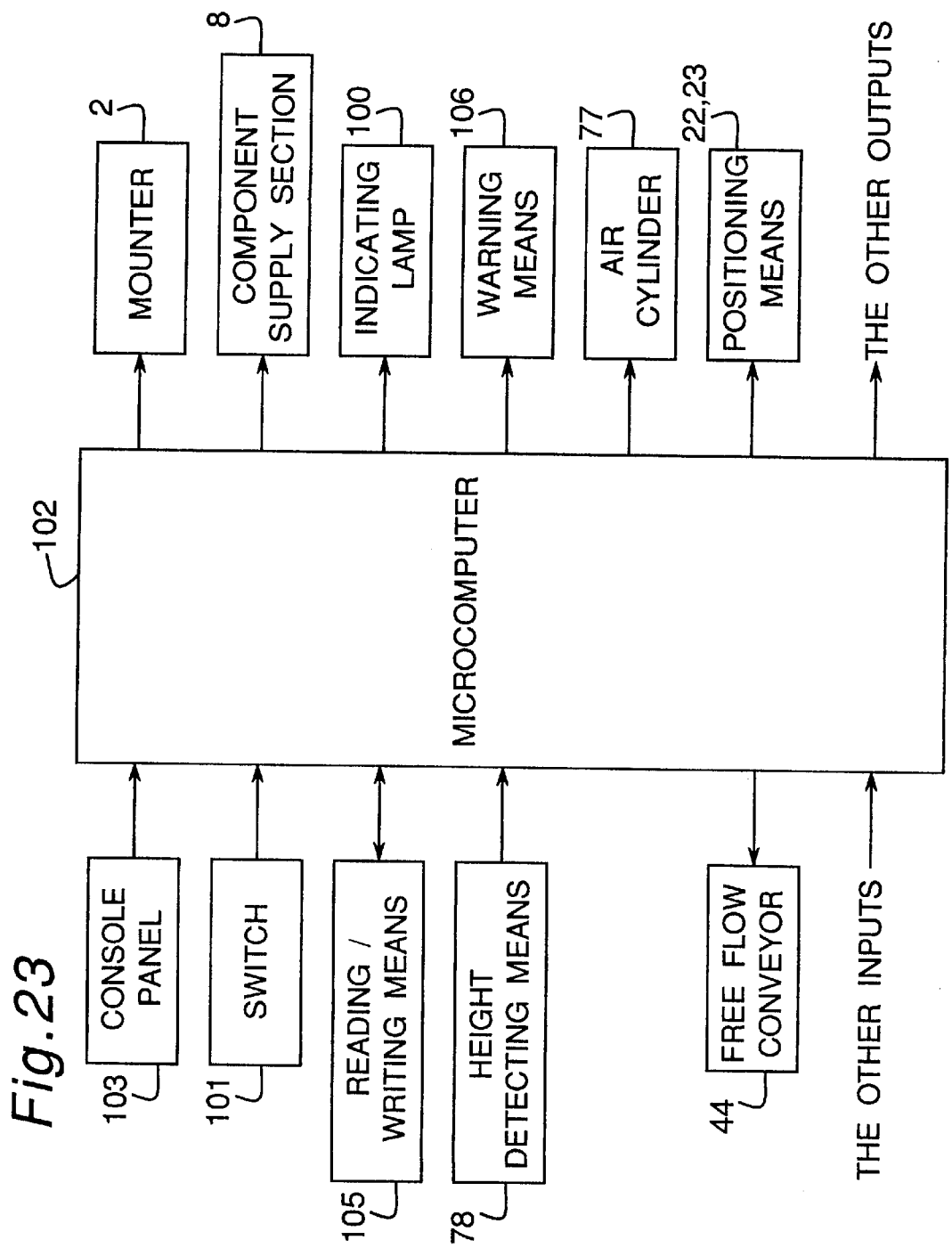
FIG. 23 is a block diagram showing a part of a control circuit for controlling the operations of the mounter and the component supply section.

Such a decision is executed, for example, by a microcomputer 102 as shown in FIG. 23 for controlling the operations of the mounter 2 and the component supply section 8. Therefore, to the microcomputer 102 are inputted an operating signal from a console panel 103 specially provided for the component supply section 8, detection signals from the photocouplers 78b through 78d of the height detecting means 78, and a variety of detection signals representing operation states as well as an ON/OFF signal from the microswitch 101. When occasion demands, the console panel 103 can be commonly used with the console panel of the mounter 2.

Figure 8:
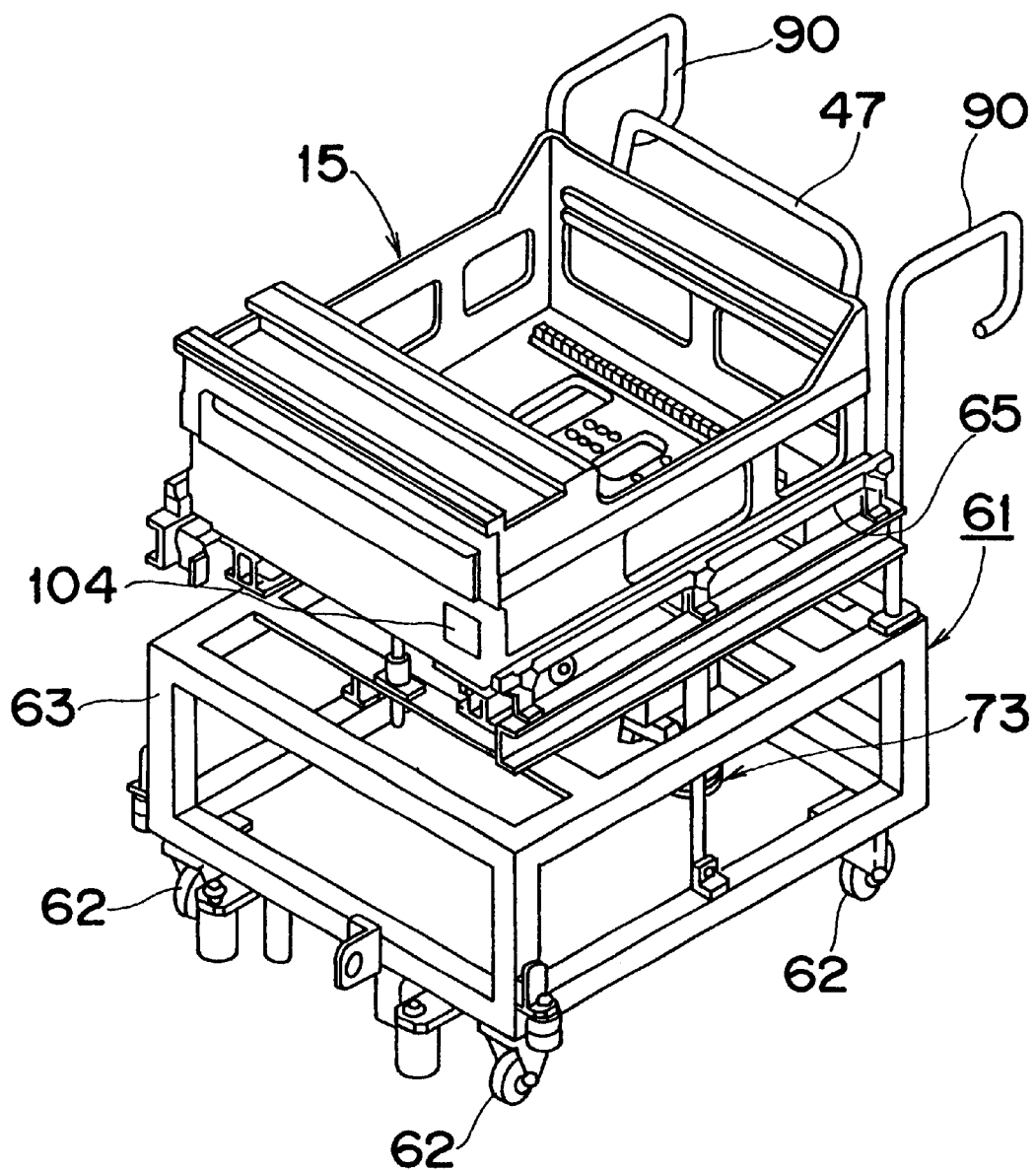
FIG. 8 is a perspective view of the truck shown in FIG. 1 and the transfer rack that is supported as carried thereon.
Figure 9:
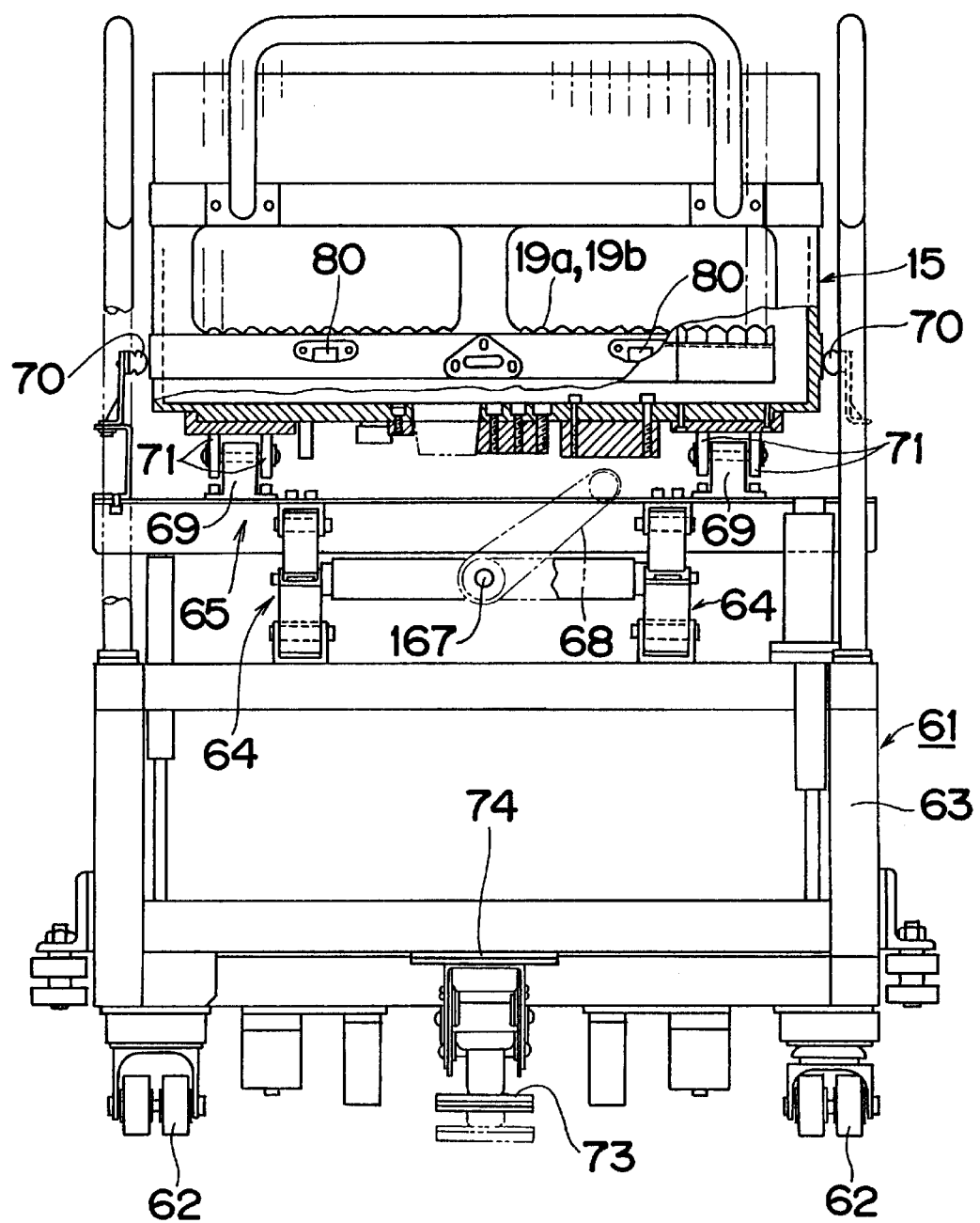
FIG. 9 is a rear view of the truck and the transfer rack shown in FIG. 8.
Figure 10:
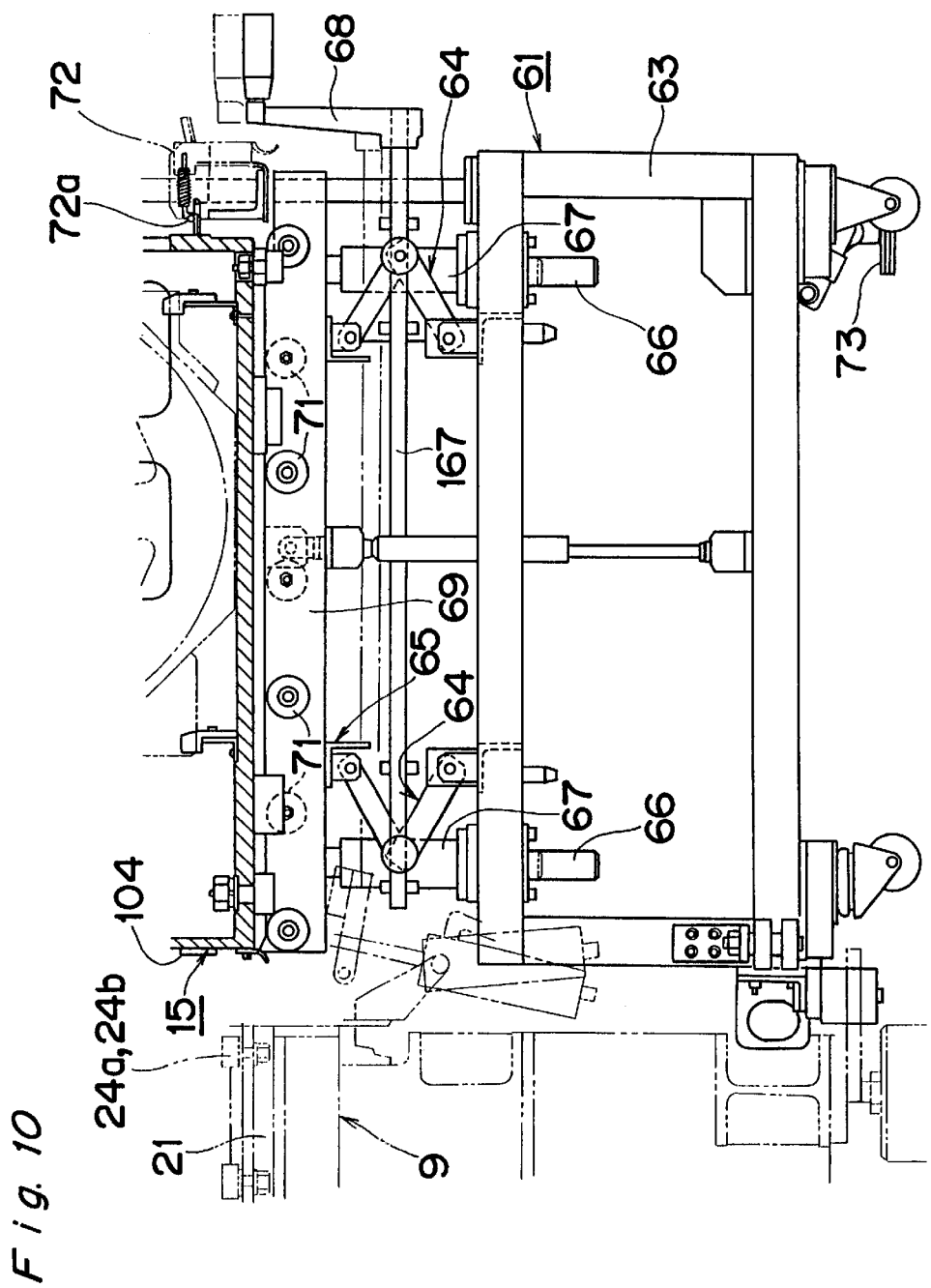
FIG. 10 is a side view of the truck shown in FIG. 8.

Furthermore, for the determination of the propriety of the components for change, a memory 104 is provided at the transfer rack 15 as shown in FIGS. 8, 10, and 11. Information regarding each component stored in each component supply cassette 14 loaded on the transfer rack 15 is stored in the memory 104. If the storage is effected every time the transfer rack 15 is loaded with each component supply cassette 14 as shown in FIG. 13, error is reduced. However, the present invention is not limited to this, and the storage may be effected at another point in time such as when the required component supply cassette 14 has been loaded.

Figure 14:
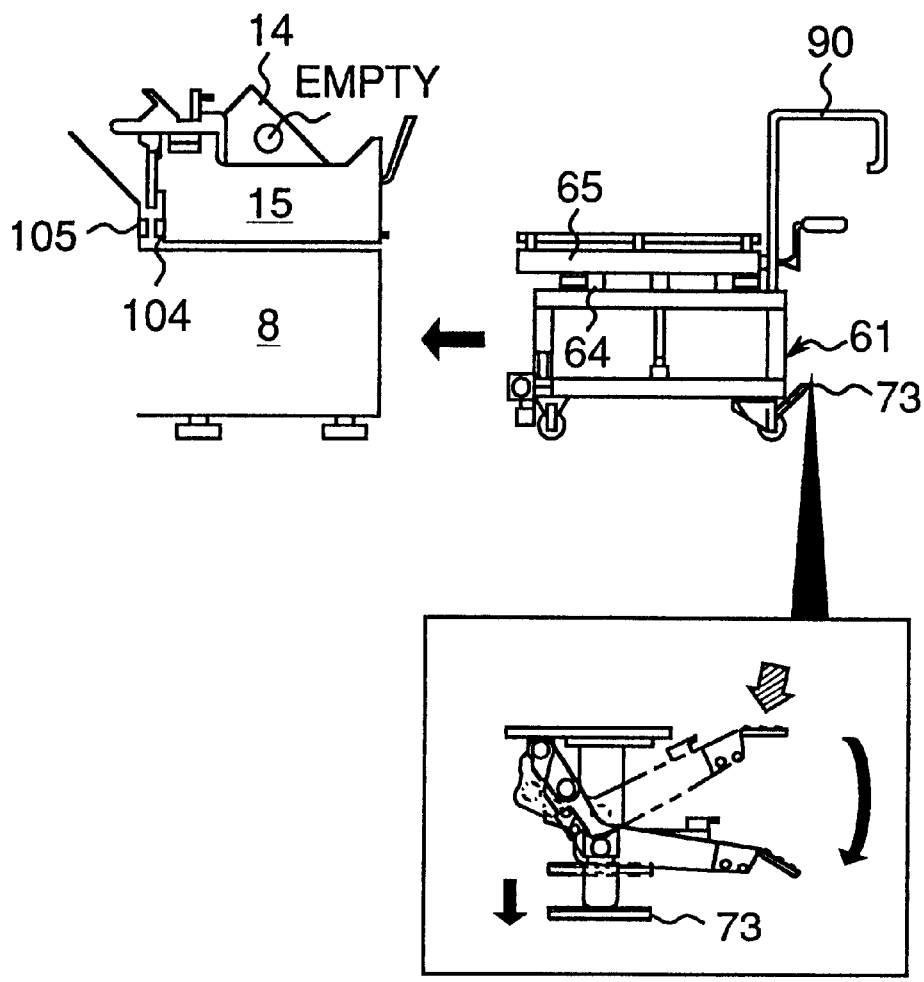
FIG. 14 are side views showing a working stage of preparing an empty truck for removing the cassette in changing a depleted component supply cassette at a component supply section.

The memory 104 is capable of reading and writing. In correspondence with this, a reading/writing means 105 for reading and writing component information at the memory 104 as shown in FIGS. 14 and 15 is provided at the component supply section 8. This is also connected to an input/output port of the microcomputer 102. The component information is information such as the number of components stored in each component supply cassette 14, other than information about the type of components. In regard to the number of components, the number of used ones and remaining ones are recorded according to the supply of components, and it can be used for another purpose such as a determination of the depletion of components.

It is to be noted that the memory 104 may be a read-only memory. In this case, it is proper to use a reading means instead of the reading/writing means 105, so that the construction and control can be made simple.

The microcomputer 102 is connected at its output side to either an indicating lamp 100 for indicating the proprieties of the states of the mounter 2 and the component supply section 8 and various operations, a warning means 106 comprised of a letter indication, a buzzer, an indicating lamp, or an appropriate combination of these items for giving a warning on the console panel 103 when a determination is made that the component is improper. The air cylinder 77, the first and second positioning means 22 and 23, and the free flow conveyor 44 are then operated to control their operations accordingly. The indicating lamp 100 can be commonly used as the warning means 106.

The microcomputer 102 manages the number of remaining components in each component supply cassette 14 loaded in the component supply section 8. When component depletion occurs, the microcomputer 102 displays this fact by the indicating lamp 100 or the console panel 103, and informs the operator of it as needed by issuing an alarm sound.

FIG. 14 shows an initial work of the procedure for withdrawing the transfer rack 15 loaded with the depleted component supply cassette 14 from the component supply section 8 in the standby state. An empty truck 61 is arranged opposite to the component supply section 8 in the standby state to put them in the correct positional relation. In the above state, the air cylinder 77 is operated by operating a truck lock key and the like on the console panel 103 so that the connecting rod 76 is engaged with the connecting bracket 75 as shown in FIG. 15A to connect and fix the truck 61 in the position. In the above state, the stand stopper 73 is operated as shown to prevent the main body 63 from moving from the connecting position.

Subsequently, the height adjustment of the transfer rack support section 65 on the truck 61 and the component supply section 8 is performed by the toggle mechanisms 64. The height adjustment is performed so that the indicating lamp 100 emits green light for indicating the propriety in accordance with the detection of the height detecting means 78 as shown in FIG. 153.

When the height adjustment is completed, the automatic first and second positioning means 22 and 23 are made to automatically enter into a positioning release state by a positioning key and the like on the console panel 103. Thereafter, the free flow conveyor 44 is moved upward by a free flow key and the like on the console panel 103 to complete the preparation.

Figure 16:
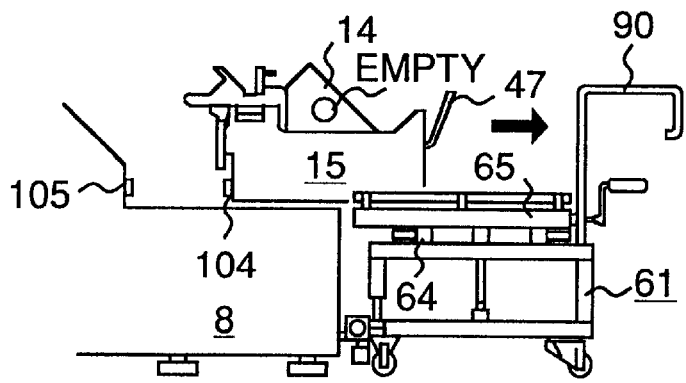
FIG. 16 is a side view, of a working stage of unloading a depleted component supply cassette at the component supply section by the truck after the height adjustment in FIGS. 15A and 15B.
Figure 17A:
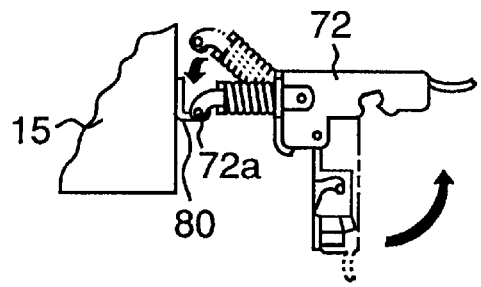
FIGS. 17A and 17B are side views showing a state of a position retaining work exhibiting a working stage of retaining the depleted component supply cassette at a point of time when it is unloaded to a specified position.
Figure 17B:
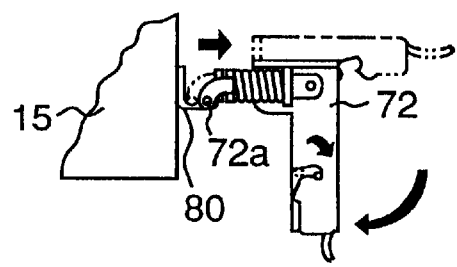

With this preparation completion, the transfer rack 15 on the component supply section 8 is passed to the truck 61 as shown in FIG. 16 to draw out the transfer rack 15 onto the transfer rack support section 65. The removal of the transfer rack 15 from the transport stand 9 in this stage is detected by the microswitch 101. When the transfer rack 15 is placed in a specified position on the truck 61, the transfer rack is held on the truck 61 by engaging the buckles 72a of the retainers 72 with the metal hook 80 according to a procedure as shown in FIGS. 17A and 17B.

Then, by operating again the truck lock key, the connection of the connecting bracket 75 with the connecting rod 76 between the truck 61 and the component supply section 8 is released. The stand stopper 73 is raised to release the movement-preventing state effected by it.

Figure 18:
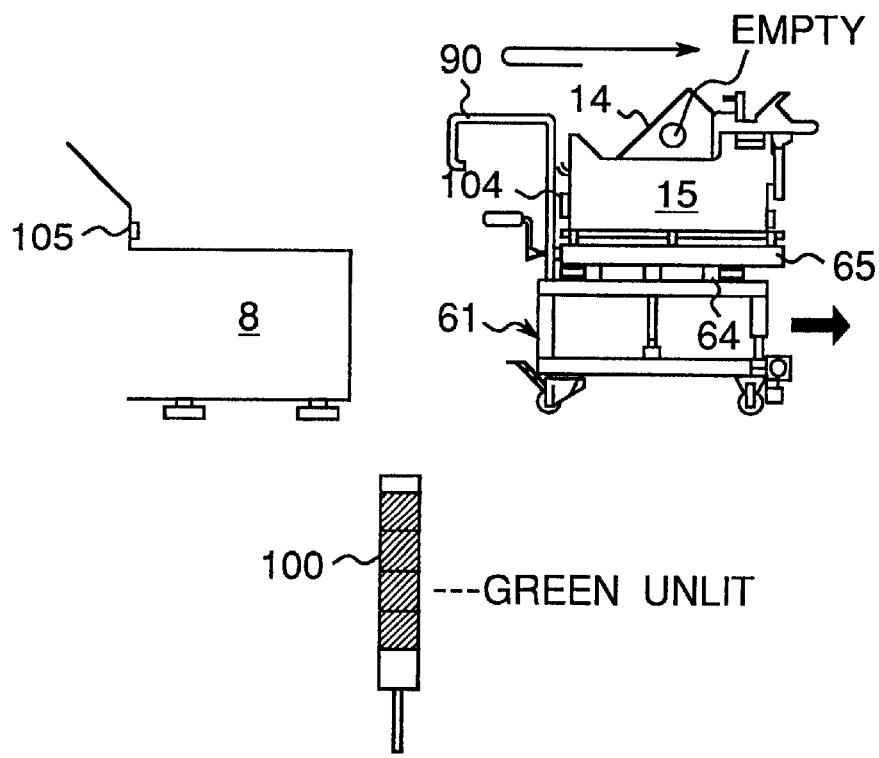
FIG. 18 is a side view showing a working stage of carrying the transfer rack by the truck with the transfer rack retained in position.

Subsequently, the truck 61 is moved to a specified working position as shown in FIG. 18. The movement of the truck 61 from the component supply section 8 is determined by the microcomputer 102 upon detecting the non-interrupted state of the photocouplers 78b through 78d of the height detecting means 78, and when the indicating lamp 100 is unlit. The working position is the position where newly-storing of components in the depleted component supply cassette 14, or where changing of the cassette for a component supply cassette 14 that is storing components to be subsequently required is performed.

Figure 19:
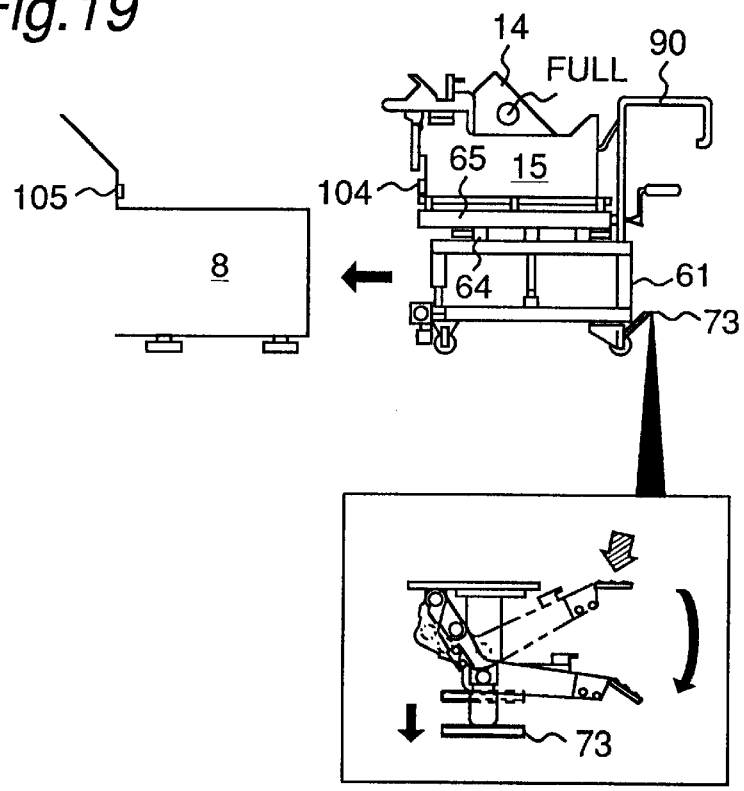
FIG. 19 is a side view showing a working stage of carrying a transfer rack loaded with a new component supply cassette by the truck to the component supply section and positioning it.
Figure 20:
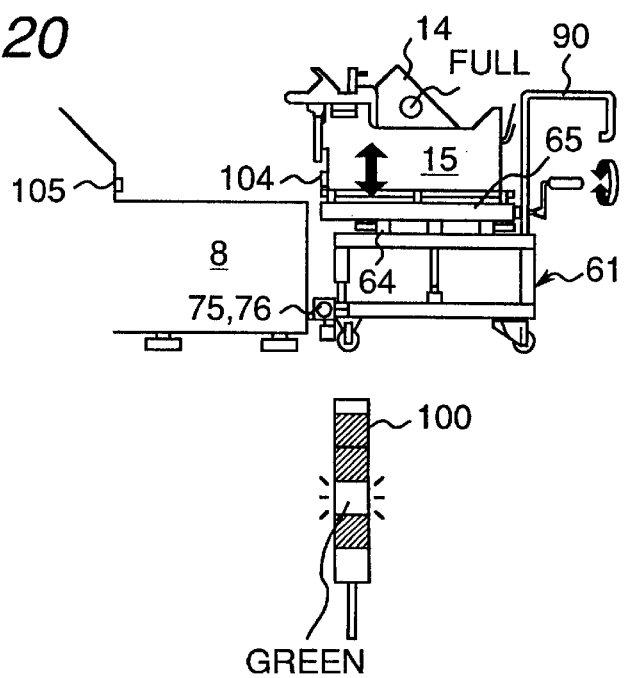
FIG. 20 is a side view showing a working stage of adjusting in height the transfer rack loaded with the new component supply cassette on the truck relative to the component supply section.

In the component supply section 8 from which the truck 61 has been removed, a previously prepared or newly prepared truck 61 equipped with a transfer rack 15 loaded with the component supply cassettes 14 accommodating therein a required amount of necessary components is moved from the above-mentioned working position as shown in FIG. 19. When they are put in the specified positional relation, by operating the truck lock key, the truck 61 is connected to the component supply section 8. Further, by operating the stand stopper 73 in the same manner as described above, the movement of the truck 61 is prevented and the height adjustment of the transfer rack 15 is performed.

Figure 21:
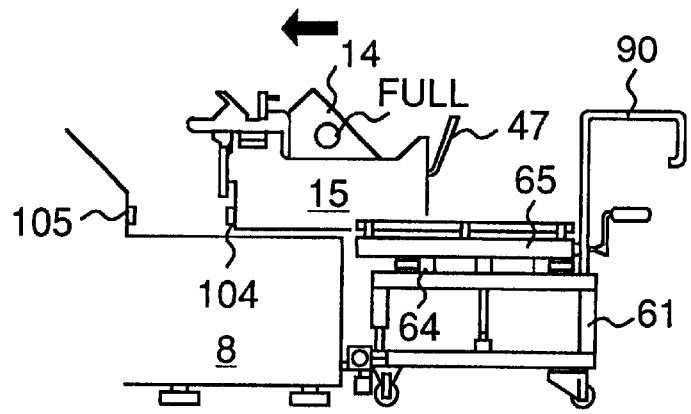
FIG. 21 is a side view showing a working stage of delivering the transfer rack after the height adjustment from on the truck onto the component supply section.

When the above operation is completed, the transfer rack 15 on the truck 61 is passed to the component supply section 8 as shown in FIG. 21 to deliver the transfer rack 15 from on the truck 61 onto the component supply section 8, thereby performing the collective change. Subsequently, the free flow key and the like are operated on the console panel 103 to move the free flow conveyor 44 down. Thereafter, the automatic first and second positioning means 22 and 23 are operated by the positioning key to position the transfer rack 15 on the transport stand 9.

Figure 24:
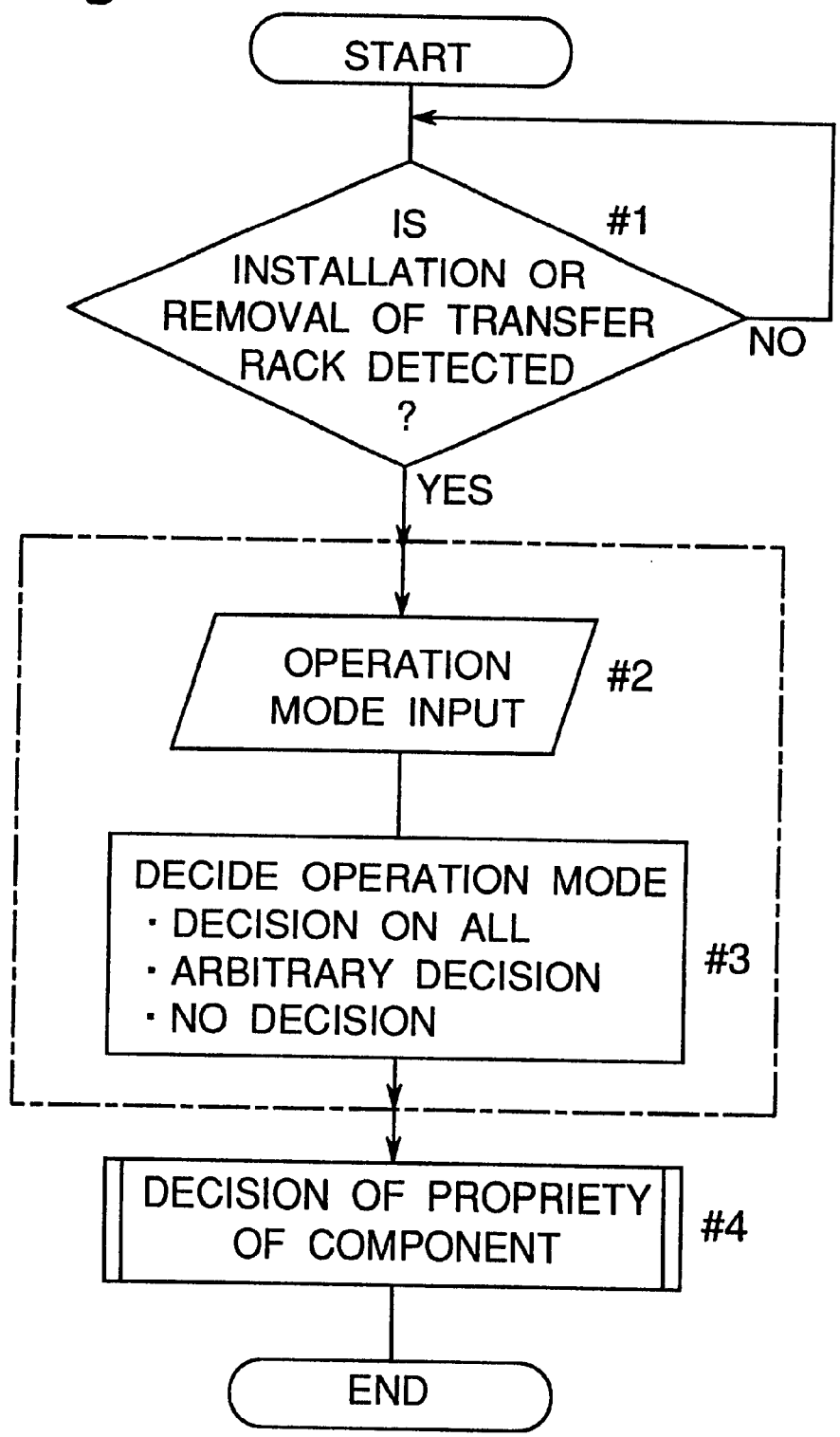
FIG. 24 is a flowchart showing the main flow of component decision.

The microcomputer 102 executes a component decision processing control on the collectively changed components according to a flowchart as shown in FIG. 24. Only when the occurrence of the loading or unloading of the transfer rack 15 is determined by an ON/OFF history of the microswitch 101 in step #1, it executes the component decision control in step #2 and the subsequent steps. In step #2, it accepts selection of an operation mode by a mode selecting key on the console panel 103.

The operation mode to be selected is any of the operation mode of executing no decision on, for example, the propriety of the component, the operation mode of executing a decision on all component supply cassettes and the operation mode of executing a decision on only the required component supply cassette. The component to be determined as one to be subjected to decision is, for example, a depleted component, or a component subject to change due to alteration of the product type. Such a component can be inputted by operating the console panel 103 or can be automatically designated by the microcomputer 102.

It is also acceptable to always execute the component propriety decision on all component supply cassettes 14 without performing the operation mode setting as above.

Figure 25:
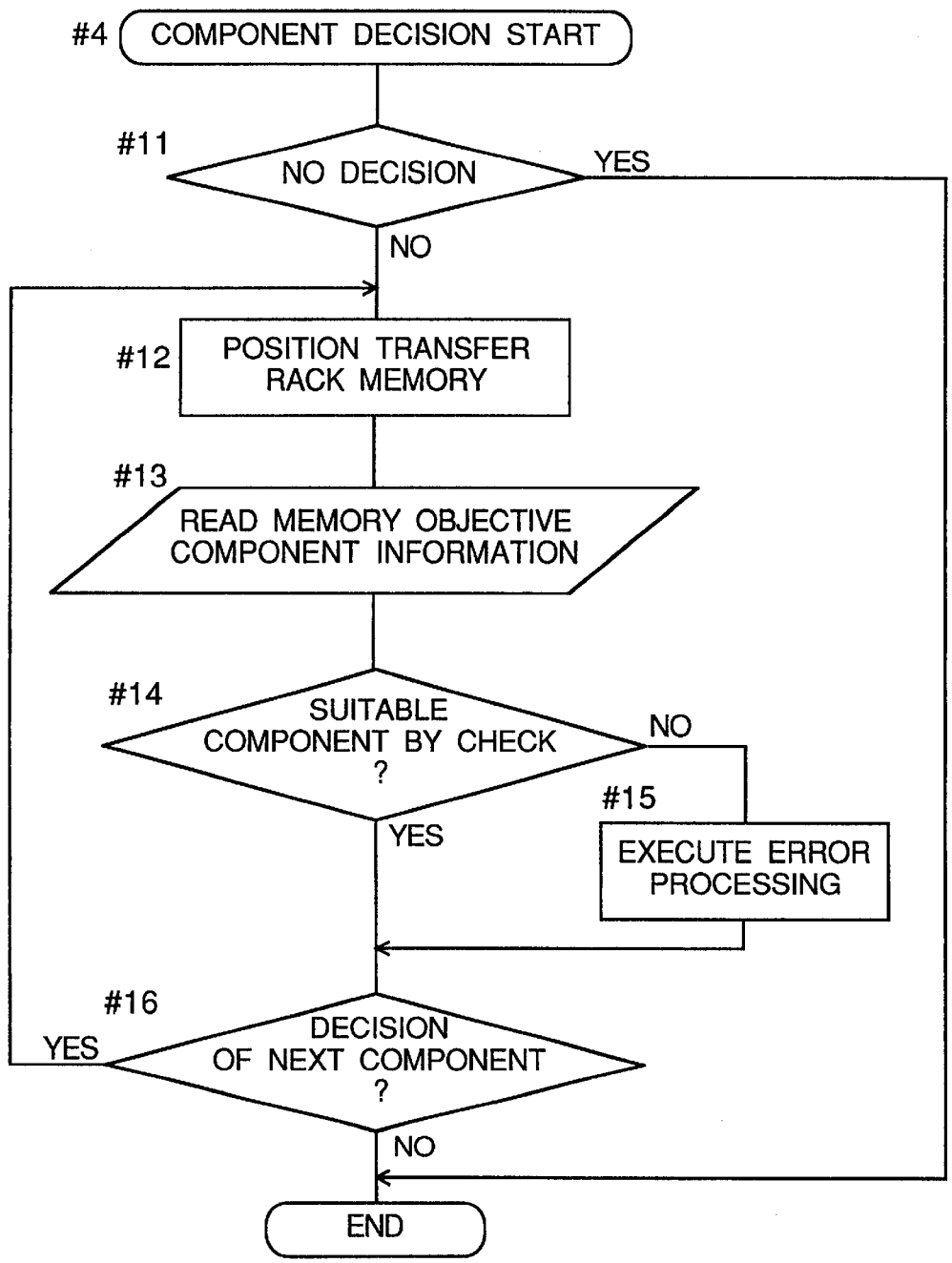
FIG. 25 is a flowchart of a component propriety decision subroutine of FIG. 24.

In step #3, the selected operation mode is decided and the program flow proceeds to a component decision subroutine of step #4. As shown in FIG. 25, the component decision subroutine of step #4 is to execute control of step #12 and subsequent steps only when a decision of component is executed in step #11. In step #12, according to the position control of the transfer rack 15 positioned on the transport stand 9, a memory 104 provided at the transfer rack 15 is subjected to positioning with the reading/writing means 105 provided at the component supply section 8. Then the program flow proceeds to step #13.

In step #13, component information regarding the component to be subjected to decision according to the operation mode (i.e., whether it is the component relevant to all the component supply cassettes 14, or the component relevant to the designated component supply cassette 14) is read from the memory 104. Then, in step #14, the read component information and a preset list of required components are cross-referenced to each other to decide whether or not the objective components after the collective change are proper or improper.

When the components are improper, the program flow proceeds to step #15 to operate the warning means 106 to inform the operator of the improper components. A required error processing such as a processing for disabling the further operation to allow the mounter 2 and the component supply section 8 to be operated is then executed. In step #16, when the error processing has been executed, the program flow returns to step #12 because the subsequent component is required to be subjected to decision again. When the error processing has not been executed, the re-decision of the subsequent component is not required, and therefore the present subroutine is completed.

It is to be noted that such a component propriety decision can be executed likewise on the components to be mounted initially collectively by the transfer rack 15.

When the result of decision is proper, the microcomputer 102 enables the further operation to allow the mounter 2 and the component supply section 8 to be operated.

Figure 22:
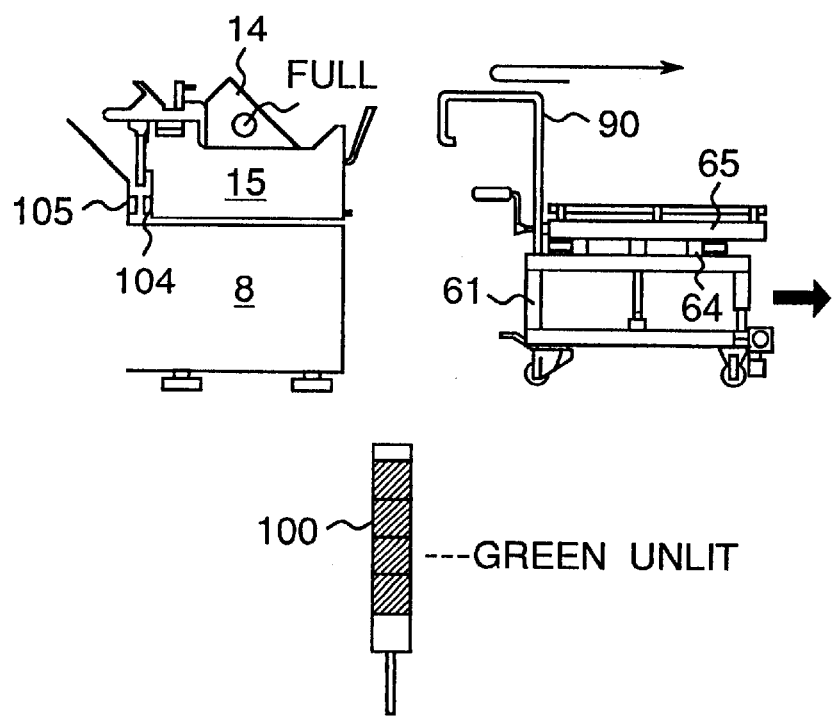
FIG. 22 is a side view showing a working stage of moving the truck to a specified position after the transfer rack has been delivered to the component supply section.

It is to be noted that the emptied truck 61 is moved again to the working position as shown in FIG. 22 to be subjected to the subsequent preparation.

As described above, a number of component supply cassettes 14 are arranged at the component supply section 8 of the objective mounter 2. The component supply cassette corresponding to the electronic component required each time by the objective mounter 2 is operated to supply the required electronic component to the mounter 2. In order to effect change of components and supply of components depleted due to consumption, the transfer rack 15 loaded with a specified number of component supply cassettes 14 positioned and supported individually is handled for the collective change. By carrying the transfer rack 15 on the truck 61 so that it is capable of being taken in and out of the truck 61, even when the seriate number of component supply cassettes 14 to be loaded in the transfer rack 15 is great, large in size, totally bulky and heavy, the transfer rack 15 can be easily moved together with the truck 61 without being influenced by these factors. By passing the transfer rack 15 loaded with the component supply cassettes 14 between the truck 61 and the component supply section 8, the withdrawal of the transfer rack 15 from the component supply section 8 to the truck 61 and the delivery of the transfer rack 15 into the component supply section 8 are timely executed for the collective change of the component supply cassettes 14. With this arrangement, the weight and bulkiness of the transfer rack. 15 loaded with the component supply cassettes 14 exert almost no influence on the operator in the collective change operation. Therefore, the collective change of the components can be achieved easily and speedily without being limited by the seriate number, size and weight of the component supply cassettes 14 to be collectively handled. This is helpful in further increasing the operation speed and the working efficiency of the objective mounter 2.

Furthermore, the transfer rack 15 delivered to the component supply section 8 is automatically positioned in the direction in which the transfer rack 15 is loaded and unloaded (delivery direction) and in the component supply direction, which is perpendicular to the direction in which the transfer rack is loaded and unloaded, by operating the automatic first and second positioning means 22 and 23. With this arrangement, the positioning is achieved surely in the two directions without the operator's individual differences and speedily by virtue of the fact that it is automatic. Therefore, a working efficiency increase can be achieved, and the possible trouble due to a deficiency in supplying components can be solved. Furthermore, as can be seen in FIG. 1, the electronic components are supplied to the electronic component mounting machine in the component supply direction (i.e., perpendicular to the delivery direction). Thus, the arrangement becomes very compact in the component supply direction.

Furthermore, the free flow conveyors 44, and the guide rollers 71 provided as guide means at the component supply section 8 and the truck 61 guide the loading and unloading of the transfer rack 15 when passing the transfer rack 15 between them. Therefore, the loading and unloading of the transfer rack 15 during the passing can be achieved smoothly without hitching, and this allows the working efficiency to be further increased.

Furthermore, the two component supply sections 8 are each loaded with a seriate number of component supply cassettes 14 required for supplying electronic components to the objective mounter 2. While one component supply section 8 is supplying components to the objective mounter 2, the other component supply section 8 is put in the standby state to execute the collective change of the electronic components without influencing the work at the objective mounter 2. Thus, the preparation for the supply of the subsequent component can be achieved. With this arrangement, the change of components at the objective mounter 2 is only required to perform switching use of the component supply sections 8. Therefore, the possible lost time at the objective mounter 2 can be suppressed to the minimum, and the collective change of the component supply cassettes 14 can be easily achieved in a minimal time.

Furthermore, the seriate number of component supply cassettes 14 to be handled collectively is the seriate number of cassettes for supplying the components to the objective mounter 2. Therefore, the collective change of cassettes for the change and replenishment of electronic components to be supplied to the objective mounter 2 can be achieved at once in a short time.

However, the present invention is not limited to this. If the seriate number is made to be a unit division seriate number of the seriate number of the cassettes for supplying components to the objective mounter 2, even when the seriate number of cassettes for supplying components to the objective mounter 2 is great, the collective change work can be easily achieved in several installments.

Furthermore, when the transfer rack 15 is changed at the component supply section 8 as described above, by automatically detecting the change and automatically determining the propriety of the components in the component supply cassette 14 loaded in the transfer rack 15 upon the detection, the propriety of the component after the change is not required to be decided manually each time. This prevents the possible deficiency of the objective product supplied with improper components and the objective work due to the inexecution, neglect or failure of the decision. Therefore, the quality can be stabilized and the yield can be increased.

Furthermore, when the decision of the propriety is executed on all the component supply cassettes 14, a failure such as the supply of improper components can be prevented in regard to every one of the components changed collectively. Further, by enabling selection between a mode of not deciding the propriety of each component, a mode of deciding all component supply cassettes, and a mode of deciding only required component supply cassettes, the possible wasteful decision of the propriety of components can be prevented.

Furthermore, by executing the decision of the propriety of each component in collectively changing components in a number of component supply cassettes 14 by the transfer rack 15 based on the component information stored in the transfer rack 15 as in the present embodiment, there is no need to store the component information in every component supply cassette 14. In contrast, it is only required to intensively store the component information by storing it or executing a similar operation in a storage means such as one memory 104 at the transfer rack 15 that handles them collectively. Therefore, the positioning can be executed once also in reading the component information of each component supply cassette 14, and this is convenient and increases the operation speed.

Furthermore, by storing the component information in the storage means such as the memory 104 capable of reading and writing, even when the types of components to be handled are changed, this arrangement can handle the change. In addition, information regarding the number of components to be used and the number of remaining components due to the component supply rate can be managed together.

It is to be noted that the transfer rack 15 can be equipped with the conventionally used memory-integrated component supply cassette 14 and used with it.

Figure 26:
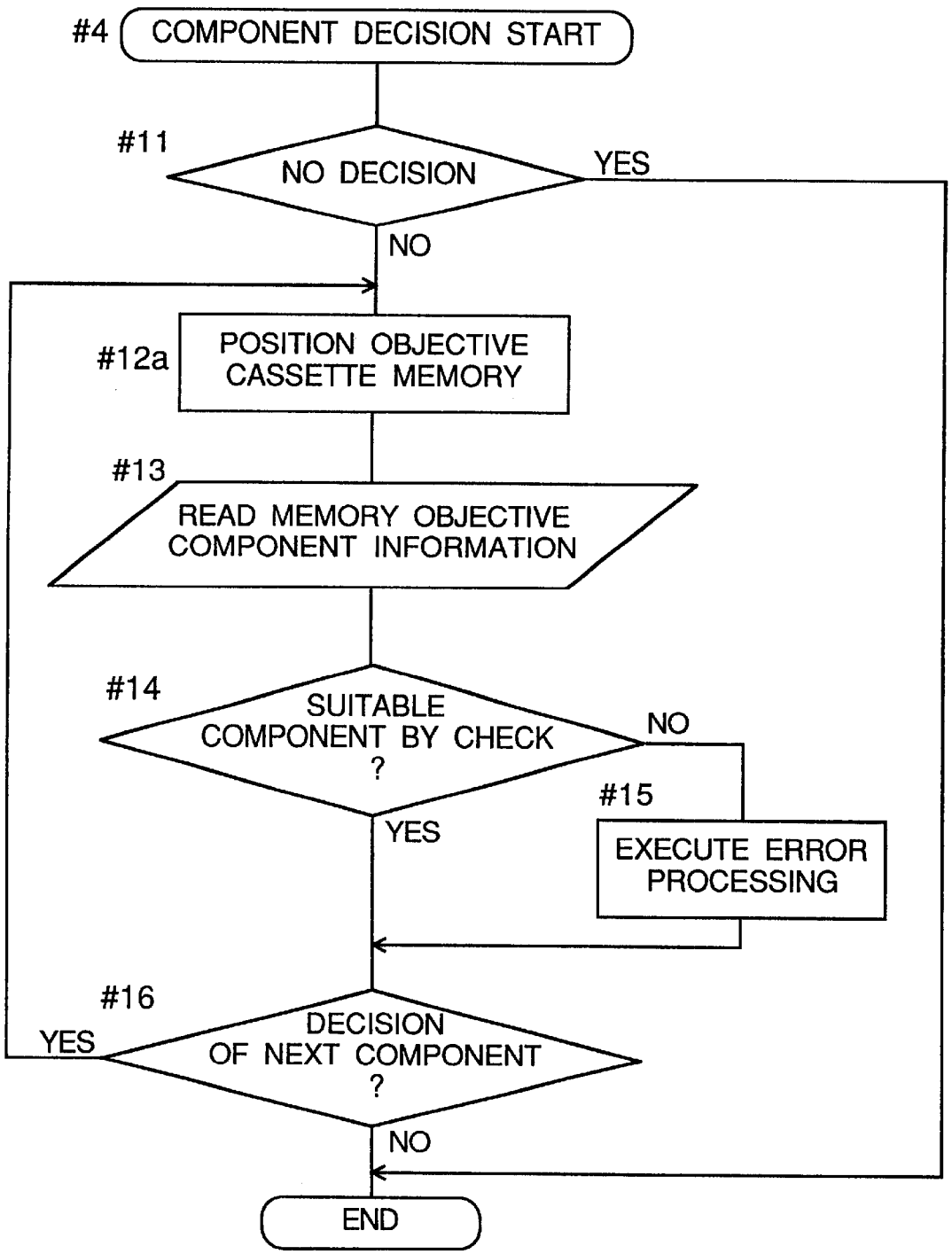
FIG. 26 is a flowchart of a component propriety decision subroutine according to a second embodiment of the present invention.
Figure 27:
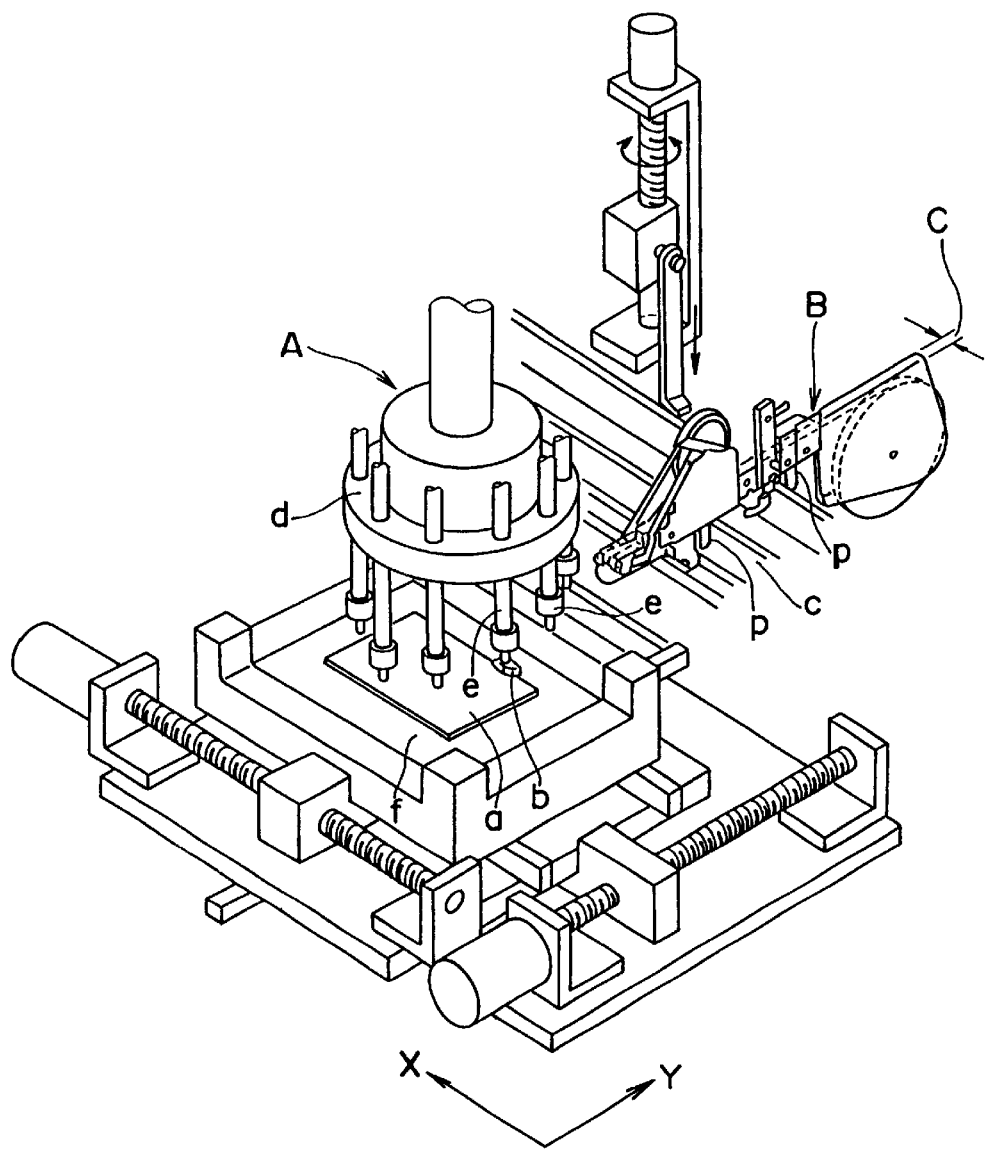
FIG. 27 is a perspective view showing a prior art mounter and its component supply section.
Figure 28:
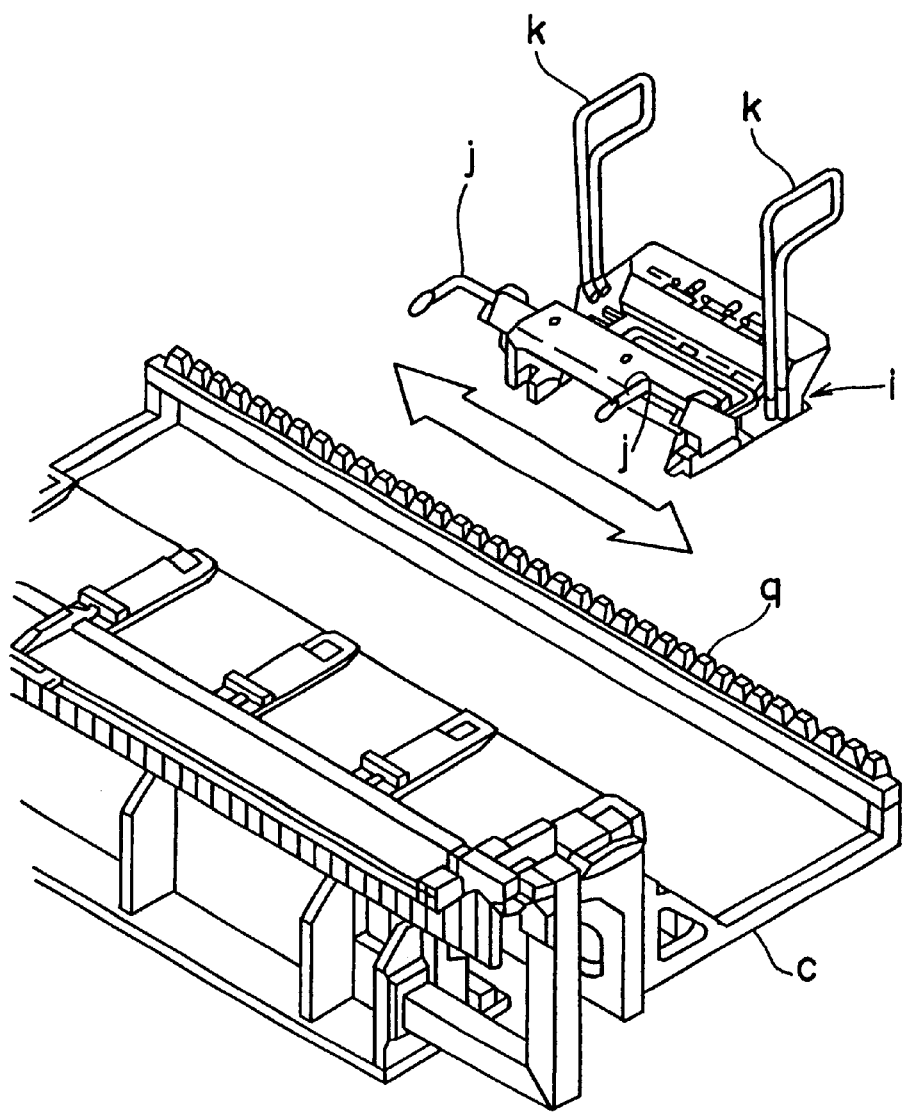
FIG. 28 is a perspective view showing a prior art method and apparatus for collectively changing components at a component supply section.

FIG. 26 shows a component decision flowchart for a case such as a second embodiment. Only the operation of executing the positioning of the memory of the objective component supply cassette 14 in step #12a differs from the operation of executing the positioning of the memory of the transfer rack 15 in step #12 in the first embodiment.

According to the present embodiment, the prior art memory-integrated component supply cassette 14 can be used as it is. In addition, the collective change of components by the transfer rack 15 and the collective setting of each memory attendant upon this are achieved in using the memory. Therefore, the present arrangement is more convenient than using the prior art memory-integrated component supply cassette 14 by individually loading and unloading it.

According to the method and apparatus for collectively changing components of the 1st and 9th aspects of the invention, a number of component supply cassettes are seriately arranged at the component supply section of the objective working machine. When collectively changing the component supply cassettes together with the transfer rack loaded with a specified number of cassettes positioned and supported individually, the transfer rack is carried on the truck while being able to be taken in and out. With this arrangement, even when the seriate number of component supply cassettes to be loaded in the transfer rack is great and the cassettes are large, bulky and heavy, the cassettes can be easily moved together with the truck without being influenced by them. Furthermore, the transfer rack loaded with the component supply cassettes are passed between the truck and the component supply section to timely execute the withdrawal of the transfer rack from the component supply section to the truck and the delivery of the transfer rack to the component supply section for the collective change of the component supply cassettes. Therefore, also in the collective change operation, the weight and bulkiness of the transfer rack loaded with the component supply cassettes exert almost no influence on the operator. Consequently, the collective change of components can be achieved easily and speedily without being limited by the seriate number, size and weight of the component supply cassettes to be handled collectively. This is helpful in further increasing the operation speed and the working efficiency of the objective working machine.

Furthermore, particularly in accordance with the 1st aspect of the invention, the transfer rack delivered to the component supply section is automatically positioned in the direction in which it is loaded and unloaded and in the direction perpendicular to the direction in which it is loaded and unloaded by operating the automatic positioning means. Therefore, the positioning can be achieved surely in the two directions without the operator's individual differences and speedily because it is done automatically. Therefore, the working efficiency increases and the possible trouble due to a deficiency in supplying components can be solved.

Furthermore, particularly in accordance with the 9th aspect of the invention, the guide means provided at the component supply section and the truck guide allow for the loading and unloading of the transfer rack when passing it between them. Therefore, the loading and unloading of the transfer rack during the passing can be smoothly achieved without hitching, and this allows the working efficiency to be further increased.

According to the method for collectively changing components at a component supply section of the 2nd aspect of the present invention, the two component supply sections are each provided with a seriate number of component supply cassettes required for supplying components to the objective working machine. While supplying the components to the objective working machine by one component supply section, the other component supply section is put in the standby state so that a collective change of components can be performed for the preparation of supplying subsequent components without influencing the work at the objective working machine. Therefore, the change of components at the objective working machine is only required to perform switching use of the component supply sections. Therefore, the possible lost time at the objective working machine can be suppressed to the minimum, and the collective change of the component supply cassettes can be easily achieved with a minimal amount of time.

Furthermore, according to the method for collectively changing components at a component supply section of the 3rd aspect of the invention, the seriate number of component supply cassettes to be handled collectively in changing the components is made to be the seriate number of cassettes for supplying the components to the objective working machine. Therefore, the collective change of cassettes for the change and replenishment of the components to be supplied to the objective working machine can be achieved in a short time. According to the 4th aspect of the invention, the seriate number is made to be a unit division seriate number of the seriate number of the cassettes for supplying components to the objective working machine. Therefore, even when the seriate number of cassettes for supplying components to the objective working machine is great, the collective change can be easily achieved in several installments.

According to the method for collectively changing components at a component supply section of the 5th aspect of the invention, based on any one of the 1st through 4th aspects of the invention, when the transfer rack is changed at the component supply section, this is automatically detected. Then the propriety of the component in each component supply cassette loaded in the transfer rack after the change is automatically decided upon the detection. Therefore, the propriety of the component after the change is not required to be decided manually each time. This prevents the possible deficiency of the objective product supplied with improper components and the objective work due to the inexecution, neglect or failure of the decision. As a result, the quality can be stabilized and the yield can be increased.

According to the method for collectively changing components at a component supply section of the 6th aspect of the invention, based on the 5th aspect of the invention, the determination of the propriety is further executed on all the component supply cassettes. Therefore, a failure such as the supply of improper components can be prevented in regard to every one of the components changed collectively.

According to the method for collectively changing components at a component supply section of the 7th aspect of the invention, based on either one of the 5th and 6th aspects of the invention, the determination of the propriety of each component in collectively changing components in a number of component supply cassettes by the transfer rack is executed based on the component information stored in the transfer rack. Accordingly, there is no need to store the component information in every component supply cassette, and it is only necessary to intensively store the component information by storing it or executing a similar operation in a storage means at the transfer rack that handles them collectively. Therefore, the positioning is also allowed to be executed once in reading the component information of each component supply cassette, and this is convenient and increases the operation speed.

According to the method for collectively changing components at a component supply section of the 8th aspect of the invention, based on any one of the 5th through 7th aspects of the invention, the component information is stored in the storage means capable of reading and writing. Therefore, even when the components to be handled are changed, the method can handle the change. Thus, information regarding the number of components to be used and the number of remaining components due to the component supply rate can be managed together.

According to the apparatus for collectively changing components at a component supply section of the 10th aspect of the invention, a positioning effect similar to that of the 1st aspect of the invention is produced. The truck can retain the received transfer rack by the retaining means. Therefore, the truck can handle the transfer rack easily and speedily without the transfer rack falling off when it is carried on the truck. Furthermore, the transfer rack is adjusted in height on the truck, so that when the transfer rack is passed between the truck and the component supply section, both of them coincide with each other in height. Therefore, the transfer rack can be loaded and unloaded easily and smoothly.

According to the apparatus for collectively changing components at a component supply section of the 11th aspect of the invention, based on the 10th aspect of the invention, the relation in height between the component supply section and the transfer rack support section can be further detected by the detection means. Therefore, the relation in height between the component supply section and the transfer rack supported on the truck can be made to coincide easily and correctly so as to allow the transfer rack to pass between them smoothly.

According to the apparatus for collectively changing components at a component supply section of the 12th aspect of the invention, based on either one of the 10th and 11th aspects of the invention, the component supply section easily achieves the delivery of the transfer rack to the specified position because the front end portion of the transfer rack is formed to be received against the front end portion receiving member of the positioning means. The state of delivery to the specified position can be surely retained by the positioning of the transfer rack in the direction in which it is loaded and unloaded between the first pressure member and the front end portion receiving member. By further retaining the transfer rack between the second pressure member and the side surface receiving member in the direction perpendicular to the direction in which it is loaded and unloaded, the transfer rack can be surely positioned in the position specified by the side surface receiving member.

According to the component supply apparatus of the 13th aspect of the invention, based on the 12th aspect of the invention, the first pressure member comprises a lever member. By this arrangement, the first pressure member can be made to easily retreat from the loading/unloading path of the transfer rack when it is not in use so that it exerts no influence on the loading and unloading operations. The second pressure member comprises an eccentric shaft. It is placed in a position where it exerts no influence on the loading and unloading of the transfer rack and surely positions the transfer rack so that it is delivered to the specified position by its eccentric operation in the direction perpendicular to the direction in which the transfer rack is loaded and unloaded. Then the positioning can be released.

According to the apparatus for collectively changing components at a component supply section of the 14th aspect of the invention, based on either one of the 12th and 13th aspects, the portions of the transfer rack in contact with the front end portion receiving member and the first pressure member are each implemented by a roller member. Even in a state in which the transfer rack is securely positioned between them in the direction in which it is loaded and unloaded, the movement of the transfer rack in the direction perpendicular to the direction in which it is loaded and unloaded is tolerated by the rolling of the roller member. With this arrangement, the positioning of the transfer rack in the direction perpendicular to the direction in which it is loaded and unloaded by the front end portion receiving member and the second pressure member is not hindered so as to allow the correct positioning to be surely achieved.

According to the apparatus for collectively changing components at a component supply section of the 15th aspect of the invention, based on any one of the 9th through 14th aspects, the component supply section further guides the loading and unloading of the transfer rack with play from both sides by means of the guide rollers. With this arrangement, the transfer rack is allowed to be easily loaded and unloaded without serious rattling or directional disorder with a margin provided for the process of loading and unloading the transfer rack. In the state in which the transfer rack is delivered to the specified position, no serious displacement occurs in position and posture. With this arrangement, the transfer rack can be smoothly positioned while being corrected in the specified position and posture.

According to the apparatus for collectively changing components at a component supply section of the 16th aspect of the invention, based on any one of the 9th through 15th aspects of the invention, the component supply section surely retains the received transfer rack in the positioning support section so as to allow the transfer rack to be surely positioned at a specified height. In loading and unloading the transfer rack, the loading/unloading guide section guides the loading and unloading of the transfer rack by momentarily lifting the transfer rack from the positioning support section. With this arrangement, the transfer rack is loaded and unloaded without being influenced by the secure support structure for the positioning, and the positioning support section can be prevented from premature wearing.

According to the apparatus for collectively changing components at a component supply section of the 17th aspect of the invention, based on any one of the 9th through 16th aspects, an effect similar to that of the 5th aspect of the invention can be produced by any of the component information stored in the storage means provided at the transfer rack or each component supply cassette supported on the transfer rack.

According to the apparatus for collectively changing components at a component supply section of the 18th aspect of the invention, based on the 17th aspect of the invention, the mode selecting means selects between a variety of decision modes such as a mode of not deciding the propriety of each component, a mode of deciding all component supply cassettes, and a mode of deciding only required component supply cassettes. Therefore, the possible wasteful decision of the propriety of components can be prevented by the selection according to the actual circumstances.

According to the apparatus for collectively changing components at a component supply section of the 19th aspect of the invention, based on either one of the 17th and 18th aspects of the invention, the component information is stored in the storage means capable of reading and writing similarly to the 8th aspect of the invention. Therefore, even when the component to be handled is changed, the apparatus can handle the change. Information regarding the number of components to be used and the number of remaining components consequent upon the component supply and the like can be managed together.

According to the transfer rack of the 20th aspect of the invention, when collectively handling the components that are positioned and supported in the specified number of component supply cassettes for the change, the determination of the propriety of the components after the change is executed by the component information stored in the transfer rack itself similar to the 7th aspect of the invention. With this arrangement, there is no need to retain the component information in every component supply cassette, and instead it is proper to intensively store the component information. This arrangement also provides a convenience in reading the component information as well as an advantage that the means for retaining the component information corresponding to each component is required to be only one in number.

According to the truck of the 21st aspect of the invention, the transfer rack loaded with a specified seriate number of component supply cassettes can be put on the truck, and the transfer rack 15 able to be easily taken in and out by the guide means. While retaining the transfer rack by the retaining means to prevent the transfer rack from falling off, the truck can run smoothly on the running wheels provided at its main body so as to move freely.

According to the truck of the 22nd aspect of the invention, based on the 21st aspect of the invention, the stopper means is further operated to prevent the movement of the main body on the running wheels as needed and stabilize the main body in the specified position. With this arrangement, the collective change of a number of component supply cassettes by the transfer rack at the component supply section and the change section can be easily and stably achieved without any trouble.

According to the truck of the 23rd aspect of the invention, based on either one of the 21st and 22nd aspects of the invention, when the truck is put in the specified positional relation with the component supply section of the objective working machine, the component supply section is further connected with the main body by the connecting means to allow the positional relation between them to be surely retained. Therefore, the operation of changing a heavy transfer rack loaded with a number of component supply cassettes can be achieved easily and smoothly without any trouble such as hitching.

In the embodiments, instead of using the truck, an operator can pass the component supply cassettes to the component supply section and vice versa by the above manner described in the embodiments, in order to collectively change components at a component supply section, although there are the above-described issues.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of collectively changing electronic components at an electronic component supply section, comprising:

loading a transfer rack with a plurality of component supply cassettes for storing electronic components, each of the component supply cassettes being individually positioned and supported in the transfer rack;

delivering the transfer rack onto a component supply section of an electronic component mounting machine in a delivery direction;

positioning the transfer rack at the component supply section of the electronic component mounting machine by using an automatic positioning device, the automatic positioning device moving the transfer rack as necessary in a direction parallel to the delivery direction and in a component supply direction perpendicular to the delivery direction;

supplying the electronic components from the component supply cassettes in the transfer rack to the electronic component mounting machine in the component supply direction according to a mounting requirement of the electronic component mounting machine; and collectively replacing the plurality of component supply cassettes in the transfer rack when an alternate type of electronic component is required by the electronic component mounting machine and when the electronic components stored on the plurality of component supply cassettes have been consumed by the component supply section of the electronic component mounting machine.

2. The method of claim 1, wherein said delivery of the transfer rack comprises delivery by a truck, the transfer rack being retained in the truck during a portion of said delivery, said collective replacing of the plurality of component supply cassettes in the transfer rack comprising passing the transfer rack from the component supply section of the electronic component mounting machine to the truck so as to remove the transfer rack from the component supply section.

3. The method of claim 1, wherein said loading of the transfer rack with the component supply cassettes comprises arranging the component supply cassettes in the transfer rack in a series.

4. The method of claim 1, wherein said delivering of the transfer rack comprises engaging the transfer rack with the component supply section while moving the transfer rack in said delivery direction.

5. The method of claim 1 wherein said supplying of the electronic components to the electronic component mounting machine comprises providing a required number of component supply cassettes.

6. The method of claim 5, wherein said collective replacing of the plurality of component supply cassettes in the transfer rack is automatically detected, and upon automatically detecting said collective replacement, a propriety of the electronic components in each component supply cassette in the transfer rack after said collective replacement is automatically determined.

7. The method of claim 5, wherein said delivery of the transfer rack comprises delivery by a truck, the transfer rack being retained in the truck during a portion of said delivery, said collective replacing of the plurality of component supply cassettes in the transfer rack comprising passing the transfer rack from the component supply section of the electronic component mounting machine to the truck so as to remove the transfer rack from the component supply section.

8. The method of claim 1, wherein said supplying of the electronic components to the electronic component mounting machine comprises providing a unit division number of a required number of component supply cassettes.

9. The method of claim 8, wherein said collective replacing of the plurality of component supply cassettes in the transfer rack is automatically detected, and upon automatically detecting said collective replacement, a propriety of the electronic components in each component supply cassette in the transfer rack after said collective replacement is automatically determined.

10. The method of claim 8, wherein said delivery of the transfer rack comprises delivery by a truck, the transfer rack being retained in the truck during a portion of said delivery, said collective replacing of the plurality of component supply cassettes in the transfer rack comprising passing the transfer rack from the component supply section of the electronic component mounting machine to the truck so as to remove the transfer rack from the component supply section.

11. The method of claim 1, wherein the component supply section includes a first portion for holding a transfer rack with a plurality of component supply cassettes for storing electronic components and includes a second portion for holding a transfer rack with a plurality of component supply cassettes for storing electronic components, wherein during said supplying of the electronic components from the transfer rack held by the first portion to the component supply section, the second portion is placed in a standby mode so as to allow the plurality of component supply cassettes in the transfer rack held by the second portion to be collectively replaced.

12. The method of claim 11, wherein said supplying of the electronic components to the electronic component mounting machine comprises providing a required number of component supply cassettes from the transfer rack held by each of the first portion and the second portion.

13. The method of claim 11, wherein said supplying of the electronic components to the electronic component mounting machine comprises providing a unit division number of a required number of component supply cassettes from the transfer rack held by each of the first portion and the second portion.

14. The method of claim 11, wherein said collective replacing of the plurality of component supply cassettes in the transfer rack held by the second portion is automatically detected, and upon automatically detecting said collective replacement, a propriety of the electronic components in each component supply cassette in the transfer rack held in the second portion after said collective replacement is automatically determined.

15. The method of claim 11, wherein delivery of a transfer rack onto each of the first portion and the second portion comprises delivery by a truck, the transfer rack being retained in the truck during a portion of said delivery, said collective replacing of the plurality of component supply cassettes in the transfer rack held by the first portion and the second portion comprising passing the transfer rack from the component supply section of the electronic component mounting machine to the truck so as to remove the transfer rack from the component supply section.

16. The method of claim 1, wherein said collective replacing of the plurality of component supply cassettes in the transfer rack is automatically detected, and upon automatically detecting said collective replacement, a propriety of the electronic components in each component supply cassette in the transfer rack after said collective replacement is automatically determined.

17. The method of claim 16, further comprising storing electronic component information in a storage device on the transfer rack, the storage device being operable to read and write.

18. The method of claim 17, wherein said delivery of the transfer rack comprises delivery by a truck, the transfer rack being retained in the truck during a portion of said delivery, said collective replacing of the plurality of component supply cassettes in the transfer rack comprising passing the transfer rack from the component supply section of the electronic component mounting machine to the truck so as to remove the transfer rack from the component supply section.

19. The method of claim 16, wherein said delivery of the transfer rack comprises delivery by a truck, the transfer rack being retained in the truck during a portion of said delivery, said collective replacing of the plurality of component supply cassettes in the transfer rack comprising passing the transfer rack from the component supply section of the electronic component mounting machine to the truck so as to remove the transfer rack from the component supply section.

20. The method of claim 16, wherein said determining of the propriety is conducted by using electronic component information stored in the transfer rack, and wherein the electronic component information corresponds to the electronic components stored in the component supply cassettes loaded in the transfer rack.

21. The method of claim 20, wherein said delivery of the transfer rack comprises delivery by a truck, the transfer rack being retained in the truck during a portion of said delivery, said collective replacing of the plurality of component supply cassettes in the transfer rack comprising passing the transfer rack from the component supply section of the electronic component mounting machine to the truck so as to remove the transfer rack from the component supply section.

22. The method of claim 20, further comprising storing electronic component information in a storage device on the transfer rack, the storage device being operable to read and write.

23. The method of claim 16, further including determining the propriety for all component supply cassettes in a transfer rack.

24. The method of claim 23, wherein said determining of the propriety is conducted by using electronic component information stored in the transfer rack, and wherein the electronic component information corresponds to the electronic components stored in the component supply cassettes loaded in the transfer rack.

25. The method of claim 23, further comprising storing electronic component information in a storage device on the transfer rack, the storage device being operable to read and write.

26. The method of claim 23, wherein said delivery of the transfer rack comprises delivery by a truck, the transfer rack being retained in the truck during a portion of said delivery, said collective replacing of the plurality of component supply cassettes in the transfer rack comprising passing the transfer rack from the component supply section of the electronic component mounting machine to the truck so as to remove the transfer rack from the component supply section.

* * * * *